US008213226B2

(12) United States Patent
Carman

(10) Patent No.: US 8,213,226 B2
(45) Date of Patent: Jul. 3, 2012

(54) VERTICAL TRANSISTOR MEMORY CELL AND ARRAY

(75) Inventor: Eric Carman, Cernex (FR)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 12/632,394

(22) Filed: Dec. 7, 2009

(65) Prior Publication Data

US 2010/0142294 A1    Jun. 10, 2010

Related U.S. Application Data

(60) Provisional application No. 61/120,173, filed on Dec. 5, 2008.

(51) Int. Cl.
*G11C 11/34* (2006.01)

(52) U.S. Cl. ........ 365/177; 365/174; 365/155; 365/149; 365/103

(58) Field of Classification Search .................. 365/177, 365/174, 155, 149, 103
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |
| 4,807,195 A | 2/1989 | Busch et al. | |
| 4,954,989 A | 9/1990 | Auberton-Herve et al. | |
| 4,979,014 A | 12/1990 | Hieda et al. | |
| 5,010,524 A | 4/1991 | Fifield et al. | |
| 5,144,390 A | 9/1992 | Matloubian | |
| 5,164,805 A | 11/1992 | Lee | |
| 5,258,635 A | 11/1993 | Nitayama et al. | |
| 5,313,432 A | 5/1994 | Lin et al. | |

(Continued)

FOREIGN PATENT DOCUMENTS

CA       272437     7/1927

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Thong Q Le
(74) *Attorney, Agent, or Firm* — Wilmer Cutler Pickering Hale and Dorr LLP

(57) ABSTRACT

A semiconductor device along with circuits including the same and methods of operating the same are described. The device includes an electrically floating body region and a gate disposed about a first portion of the body region. The device includes a source region adjoining a second portion of the body region, the second portion adjacent the first portion and separating the source region from the first portion. The device includes a drain region adjoining a third portion of the body region, the third portion adjacent the first portion and separating the drain region from the first portion, wherein the source and drain regions are opposing.

92 Claims, 10 Drawing Sheets

U.S. PATENT DOCUMENTS

| | | | |
|---|---|---|---|
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |

| Patent/Publication | Date | Inventor(s) |
|---|---|---|
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0180995 A1* | 7/2008 | Okhonin .................. 365/182 |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |

| | | |
|---|---|---|
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | 01/24268 | 4/2001 |
| WO | 2005/008778 | 1/2005 |

OTHER PUBLICATIONS

Arimoto, A High-Density Scalable Twin Transistor RAM (TTRAM) with Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm Box, Oct. 2008, SOI Conference.
Bae, Evaluation of 1T RAM using Various Operation Methods with SOONO (Silicon-On-ONO) device, Dec. 2008, IEDM.
Ban, A Scaled Floating Body Cell (FBC) Memory with High-k+Metal Gate on Thin-Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006. IEDM '06. International, IEEE, Dec. 11-13, 2006.
Bawedin, Maryline, et al., A Capacitorless 1T Dram on SOI Based on Dynamic Coupling and Double-Gate Operation, IEEE Electron Device Letters, vol. 29, No. 7, Jul. 2008.
Blagojevic et al., Capacitorless 1T DRAM Sensing Scheme Automatice Reference Generation, 2006, IEEE J.Solid State Circuits.
Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. On El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices; vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces Responsible for Junction Leakage on SOI, May 2009, ICSI.

Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two-Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid-State Circuits, vol, 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562μm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-Ono (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Wall nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Decive, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Tanabe et al., A 30-ns. 64-MB DRAM with Built-in-Self-Test and Self-Repair Function, IEEE Journal of Solid State Circuits, vol. 27, No. 11, pp. 1525-1533, Nov. 1992.

* cited by examiner

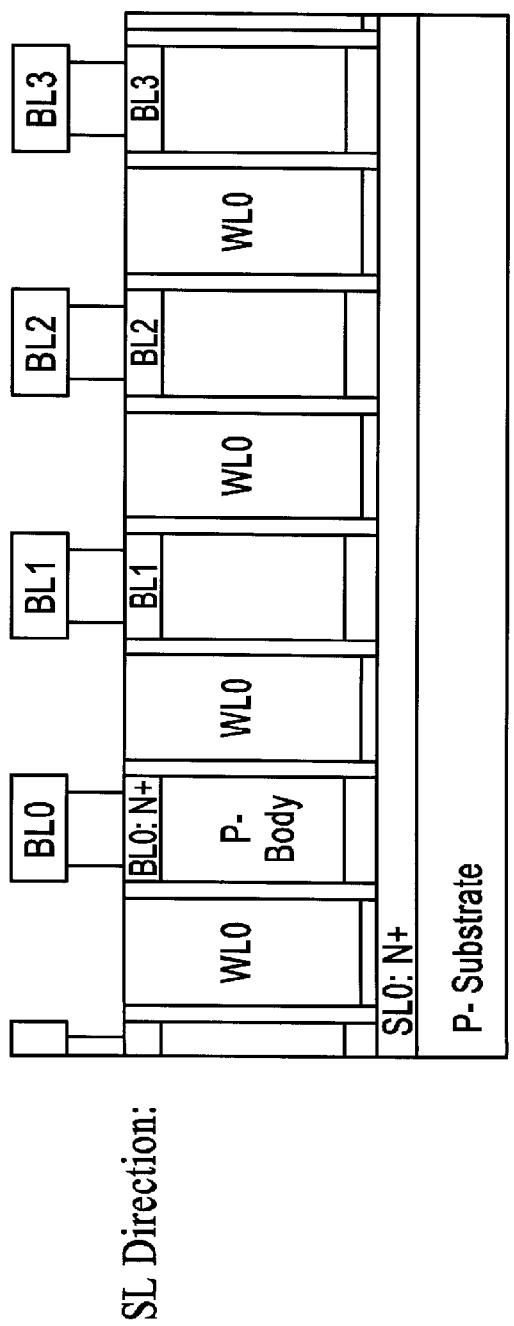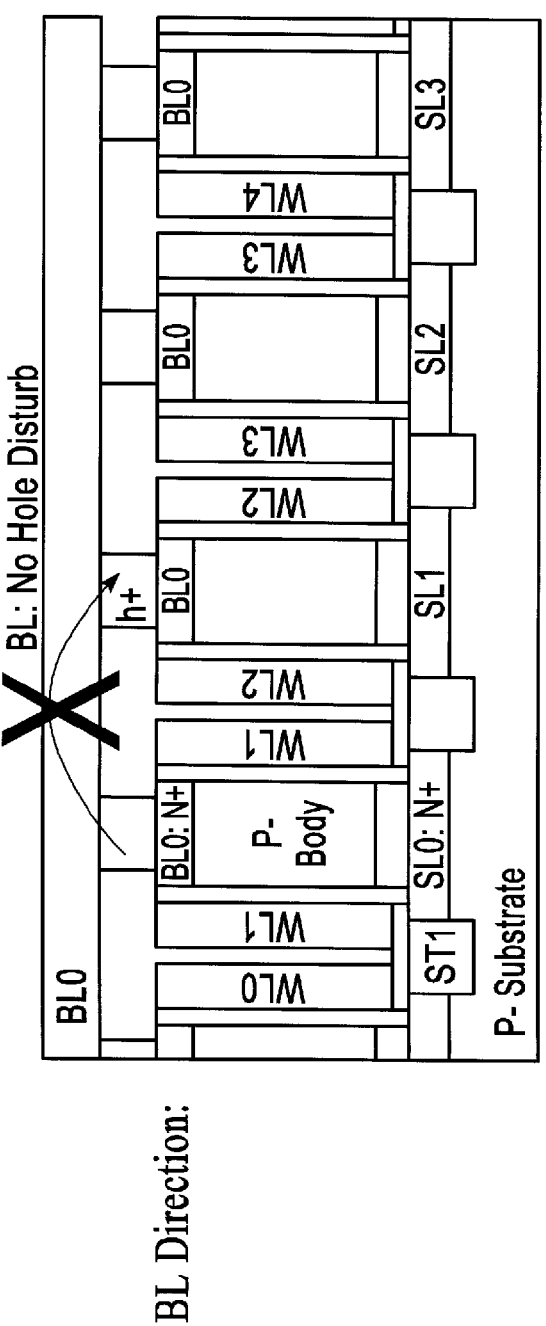

VERTICAL TRANSISTOR MEMORY CELL AND ARRAY

RELATED APPLICATION

This application claims the benefit of U.S. Patent Application No. 61/120,173, filed Dec. 5, 2008.

TECHNICAL FIELD

Embodiments relate to a semiconductor device, architecture, memory cell, array, and techniques for controlling and/or operating such device, cell, and array. More particularly, in one aspect, the embodiments relate to a dynamic random access memory ("DRAM") cell, array, architecture and device, wherein the memory cell includes an electrically floating body configured or operated to store an electrical charge.

BACKGROUND

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD) devices, fully depleted (FD) devices, multiple gate devices (for example, double or triple gate), and Fin-FET.

One type of dynamic random access memory cell is based on, among other things, the electrically floating body effect of SOI transistors; see, for example, U.S. Pat. No. 6,969,662 (the "'662 patent). In this regard, the dynamic random access memory cell may consist of a PD or a FD SOI transistor (or transistor formed in bulk material/substrate) having a channel, which is disposed adjacent to the body and separated from the gate by a gate dielectric. The body region of the transistor is electrically floating in view of the insulation layer (or non-conductive region, for example, in a bulk-type material/substrate) disposed adjacent to the body region. The state of the memory cell is determined by the concentration of charge within the body region of the SOI transistor.

Data is written into or read from a selected memory cell by applying suitable control signals to a selected word line(s), a selected source line(s) and/or a selected bit line(s). In response, charge carriers are accumulated in or emitted and/or ejected from electrically floating body region wherein the data states are defined by the amount of carriers within electrically floating body region. Notably, the entire contents of the '662 patent, including, for example, the features, attributes, architectures, configurations, materials, techniques and advantages described and illustrated therein, are incorporated by reference herein.

Referring to the operations of an N-channel transistor, for example, the memory cell of a DRAM array operates by accumulating in or emitting/ejecting majority carriers (electrons or holes) from body region. In this regard, conventional write techniques may accumulate majority carriers (in this example, "holes") in body region of memory cells by, for example, impact ionization near source region and/or drain region. In sum, conventional writing programming techniques for memory cells having an N-channel type transistor often provide an excess of majority carriers by impact ionization or by band-to-band tunneling (gate-induced drain leakage ("GIDL")). The majority carriers may be emitted or ejected from body region by, for example, forward biasing the source/body junction and/or the drain/body junction, such that the majority carrier may be removed via drain side hole removal, source side hole removal, or drain and source side hole removal, for example.

Notably, for at least the purposes of this discussion, a logic high data state, or logic "1", corresponds to, for example, an increased concentration of majority carriers in the body region relative to an unprogrammed device and/or a device that is programmed with logic low data state, or logic "0". In contrast, a logic low data state, or logic "0", corresponds to, for example, a reduced concentration of majority carriers in the body region relative to a device that is programmed with a logic high data state, or logic "1". The terms "logic low data state" and "logic 0" may be used interchangeably herein; likewise, the terms "logic high data state" and "logic 1" may be used interchangeably herein.

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines to enable the reading of the memory cells associated with such word lines. The amount of drain current is determined or affected by the charge stored in the electrically floating body region of the transistor. As such, conventional reading techniques sense the amount of channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

Additionally, conventional writing programming techniques for memory cells having an N-channel type transistor often provide an excess of majority carriers by channel impact ionization or by band-to-band tunneling (gate-induced drain leakage ("GIDL")). The majority carrier may be removed via drain side hole removal, source side hole removal, or drain and source side hole removal, for example, using the back gate pulsing. Notably, conventional programming/reading techniques often lead to relatively large power consumption (due to, for example, high writing "0" current) and relatively small memory programming window.

Furthermore, in some cases, planar memory cell arrays may exhibit row disturb effects during write "1" in which holes from a row being written can diffuse across a common bit line active area to a memory cell of an adjacent row. The combination of adjacent row hole disturb and source line disturb can require a memory cell with separated source and drain active areas which can result in a larger memory cell.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF THE DRAWINGS

FIG. 1B depicts a cross-sectional view of a number of memory cells of the array of memory cells of FIG. 1A, under an embodiment;

FIG. 1C depicts a cross-sectional view of a number of memory cells of the array of memory cells of FIG. 1A, under an embodiment;

DETAILED DESCRIPTION

There are many inventions described herein as well as many aspects and embodiments of those inventions. In one aspect, the present inventions are directed to a semiconductor device including an electrically floating body. "Electrically floating body" or "floating body" refers to a transistor body which is not coupled to, and is therefore insulated from, power or ground rails within a semiconductor device or integrated circuit (IC) chip. Various levels of charge may therefore accumulate within a floating body of a transistor. Floating-body transistors are a significant characteristic of SOI devices.

In another aspect, the present inventions are directed to techniques to control and/or operate a semiconductor memory cell (and memory cell array having a plurality of such memory cells as well as an integrated circuit device including a memory cell array) having one or more electrically floating body transistors in which an electrical charge is stored in the body region of the electrically floating body transistor. The techniques of the present inventions may employ intrinsic bipolar transistor currents (referred to herein as "source" currents) to control, write, read and/or refresh a data state in such a memory cell. In this regard, the present inventions may employ the intrinsic bipolar source current to control, write, read and/or refresh a data state in/of the electrically floating body transistor of the memory cell.

The present inventions are also directed to semiconductor memory cell, array, circuitry and device to implement such control and operation techniques. Notably, the memory cell and/or memory cell array may comprise a portion of an integrated circuit device, for example, logic device (such as, a microcontroller or microprocessor) or a portion of a memory device (such as, a discrete memory).

Figure 1A:
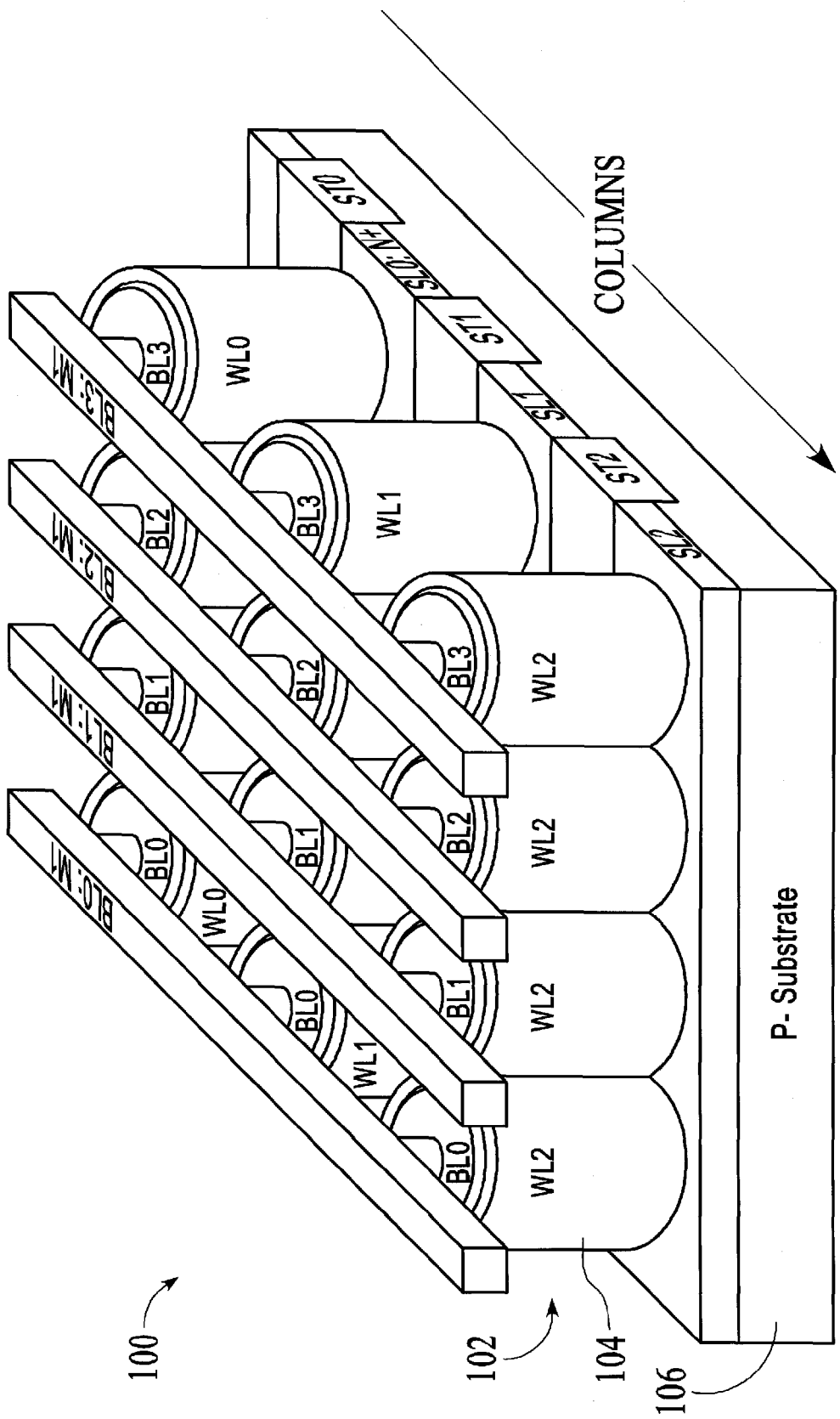
FIG. 1A depicts an array of memory cells that include electrically floating body transistors, under an embodiment.

FIGS. 1A-1G depict exemplary configurations of memory cells that include electrically floating body transistors. As shown in FIG. 1A, and in accordance with one embodiment, an array of memory cells 100 includes a plurality of memory cells implemented according to a number of rows and columns of memory cells. According to this example, a column of memory cells can be associated with a common bit line and a row of memory cells can be associated with a common source line and/or write line. While a number of rows and columns are shown, other embodiments can include other numbers and configurations. As described below, each memory cell 102 of the array of memory cells 100 includes an electrically floating body transistor 104 disposed upon an underlying substrate 106 (e.g., P-type in this example).

According to one embodiment, each electrically floating body transistor 104 comprises a vertically-disposed transistor (referred also to as a "vertical transistor 104") that includes a pillar-like structure and orientation. In one embodiment, the pillar-like structure can be fabricated to a have a height of about 80 nm, and a width of about 40 nm. While a configuration is shown, other configurations, orientations, implementations, etc. are available. As discussed further below, source regions or sources and drain regions or drains, can be separated in conjunction with a pillar-like structure which may not result in a larger memory cell based in part on the use of the pillar structure for a transistor architecture.

Moreover, as described below, the drain regions 108 (see FIGS. 1E-1F) of respective memory cells 102 are coupled to and/or connected in the conductive material which may reduce and/or prevent hole disturb effects associated with another memory cell of the array during use (FIG. 1C). For example, holes that are generated upon selecting one or more memory cells during a write operation will not diffuse across the bit line metal, thereby eliminating hole disturb between memory cells of the array. That is, holes that reach a metal coupled to the drain region 108 may immediately recombine to thereby prevent disturb effects.

For example, the drain region 108 of the vertical transistor 104 can be disposed such that a bit line can be electrically coupled to a top portion 110 of the drain region 108, wherein each bit line comprises a first type of conductor (a metal for this example). Each memory cell 102 also includes a source region 112 (see FIGS. 1E-1F) spaced apart from an associated drain region 108, a gate 114, a gate oxide region 116, and a body region 118 configured to be electrically floating, but is not so limited. As described below, the gate 114 can be disposed about a portion or boundary of the body region 118, drain region 108, and/or source region 112, and the source and drain regions can be vertically or near vertically displaced from one another about the body region 118 in an associated memory cell 102.

In one embodiment, the body region 118 of a vertical transistor 104 includes a first type of semiconductor material which may be un-doped or doped to a first polarity, and the source region 112 and drain region 108 include a second type of semiconductor material which is doped to the opposite polarity of the first type of semiconductor material. For example, the body region 118 can be configured to be electrically floating and can include a number of portions or regions (e.g., three, etc.) that collectively define the electrically floating body 118. Each of the portions comprises the same or similar material (e.g., P-type in this example). As described below, a gate 114 can be disposed about a first portion 118a or boundary of the body region 118.

A source region 112 adjoins a second portion 118b or boundary of the body region 118; the second portion 118b of the body region 118 is adjacent the first portion 118a and separates the source region 112 from the first portion 118a. A drain region 108 adjoins a third portion 118c or boundary of the body region 118; the third portion 118c of the body region 118 is adjacent the first portion 118a and separates the drain region 112 from the first portion 118a. The source region 112 and/or drain region 108 can be created using conventional doping or implantation techniques, but is not so limited. The second portion 118b and third portion 118c of the body region 118 can be configured to electrically "disconnect" (e.g., disconnect any charge that may accumulate, disconnect any inversion channel that may form) in the first portion 118a from one or more of the source and the drain regions, as described further below.

In contrast to conventional MOSFET devices, the source 112 region and/or drain region 118 of an embodiment are configured so that no portion of the source and/or drain regions is encompassed by the gate 114. Configuration of the source and/or drain regions of an embodiment includes configuration through control of the shape and/or size of a doped source and/or doped drain regions of the vertical transistor 104. In accordance with such an embodiment, because only the first portion 118a of the body region 118 is under the gate 114, charge that may accumulate or an inversion channel that may form is found only in the first portion 118a when the appropriate control signal(s) is applied to an associated memory cell 102. Moreover, in such an embodiment, no charge is accumulated and no inversion channel is formed in the second portion 118b and/or third portion 118c because these portions do not underlie the gate 114. The second portion 118b and/or third portion 118c therefore cause accumulated charge if any (or inversion channel if formed) to be discontinuous with the source region 112 and/or drain region 108.

As a result of the application of gate voltage to vertical transistor 104, charge builds up in the first portion 118a of the body region 118, but current does not flow in the body region 118 because of the absence of accumulated charge and/or a continuous inversion channel between the source and drain regions. The discontinuous configuration of the first portion 118a of the body region relative to the source and drain regions therefore acts as an "open circuit" relative to the flow of current between the source and drain regions. Any charge present in the body region 118 thus causes transistor 104 to behave like a capacitor because the region of charge in the body is disconnected from the source region 112 and/or drain region 108.

For example, the vertical transistor 104 can be used when writing or programming logic "1" as part of a memory cell operation, under an embodiment. The vertical transistor 104 of such an embodiment is an N-channel or nMOS FET, but is not so limited; transistor 104 may be a P-channel or pMOS FET in an alternative embodiment. The N-channel device includes source and drain regions comprising N+-type material while the body region 118 comprises either a P-type or intrinsic material.

A logic "1" programming or writing operation of an embodiment includes a two stage control signal application during which the gate voltage is changed from a first voltage level to a second voltage level. In operation, when writing or programming logic "1", in one embodiment, control signals having predetermined voltages are initially applied during stage one to gate 114, source region 112, and drain region 108 (respectively) of the transistor 104 of memory cell 102. The stage one control signals may result in an accumulation of minority carriers (not shown) in the electrically floating body of the vertical transistor 104. As a result of the polarity (e.g., positive) of the control signal applied to the gate with the stage one control signals, any minority carriers that happen to be present in the body region 118 accumulate in a first portion 118a of the body region 118 under an embodiment. The minority carriers may accumulate in an area of the first portion 118a under the gate, but are not so limited.

Continuing with this example, the physical behavior in the first portion 118a of the body 118 in response to the stage one control signals of an embodiment is in contrast to conventional transistor devices in which an inversion channel (also referred to as an "N-channel") forms under the gate in an area that is close to the interface between a gate oxide or dielectric and electrically floating body 118. The inversion channel is of the same type as the source and drain regions (e.g., N-type in an nMOS FET) and functions to electrically couple the source and drain regions.

The inversion channel, however, is not generally formed in the vertical transistor 104 of an embodiment and, additionally, the accumulation of minority carriers in the first portion 118a of the body region 118 if any is discontinuous with the source and/or drain regions of a memory cell 102. No inversion channel is formed in the vertical transistor 104 since as the first portion 118a of the body region 108 is electrically "disconnected" from the source and drain regions, the time required to create an inversion channel during a programming operation is quite long relative to a writing time for example. Therefore, considering an example writing time of an embodiment approximately in a range of 1-10 nanoseconds, and considering the time required for generation of an inversion channel in the "disconnected" first portion 118a of the body region 118 is much longer than 10 nanoseconds, an inversion channel is not generally created in the vertical transistor 104 during typical programming operations.

Similarly, relatively few or no minority carriers accumulate in the body region 118. Furthermore, even if an inversion channel were to form in the first portion 118a of the body region 118 as a result of a gate voltage, the inversion channel would not form in the second portion 118b and third portion 118c of the body region 118 when these portions or regions are not encompassed or surrounded by the gate in this embodiment. Therefore, any inversion channel formed under the embodiments described herein would be "disconnected" from or discontinuous with the source and drain regions.

The lack of an inversion channel or discontinuous inversion channel (if one were to form) of the vertical transistor 104 of an embodiment is in contrast to conventional transistors in which the inversion channel forms and spreads from the source to the drain and provides conductivity of the conventional transistor. However, the configuration of these conventional devices is such that the gate overlays the entire body region between the source and drain regions, and the programming times are of a length that ensures formation of an inversion channel when appropriate voltages are applied, thereby creating a continuous inversion channel that "connects" the source and drain regions upon application of the appropriate polarity signal at the gate.

Stage one control signals also generate or provide a source current in electrically floating body region 118 of the vertical transistor 104. More specifically, the potential difference between the source voltage and the drain voltage is greater than the threshold required to turn on the bipolar transistor. Therefore, source current of the vertical transistor 104 causes or produces impact ionization and/or the avalanche multiplication phenomenon among charge carriers in the electrically floating body region 18. The impact ionization produces, provides, and/or generates an excess of majority carriers (e.g., holes) in the electrically floating body region 118 of transistor 104 of memory cell 102 as described above.

Notably, in one embodiment, the source current responsible for impact ionization and/or avalanche multiplication in electrically floating body region 118 is initiated or induced by a control signal applied to gate 114 of vertical transistor 104 along with the potential difference between the source and drain regions. Such a control signal may induce channel impact ionization which raises or increases the potential of body region 118 and "turns on", produces, causes and/or induces a source current in vertical transistor 104. One advantage of the proposed writing/programming technique is that a large amount of the excess majority carriers may be generated and stored in electrically floating body region 118 of vertical transistor 104.

The stage two control signals are subsequently applied to the vertical transistor 104 when writing or programming logic "1" as described above. The stage two control signals are control signals having predetermined voltages applied to gate 114, source region 112 and drain region 108 (respectively) of vertical transistor 104 of memory cell 102 subsequent to stage one. As a result of a polarity (e.g., negative) of the control signal applied to the gate with the stage two control signals, the majority carriers of the body region 118 accumulate near an outer surface of the first portion 118a of the body region 118).

The polarity of the gate signal (e.g., negative) combined with the floating body causes the majority carriers to become trapped or "stored" near the outer surface of the first portion 118a of the body region 118. In this manner the body region 118 of the vertical transistor 104 "stores" charge (e.g., equivalently, functions like a capacitor). Thus, in this embodiment, the predetermined voltages of the stage one and stage two control signals program or write logic "1" in memory cell 102 via impact ionization and/or avalanche multiplication in electrically floating body region 118.

A logic "0" programming or writing operation of an embodiment includes a two stage control signal application during which a gate voltage is changed from a first voltage level to a second voltage level. In operation, when writing or programming logic "0", in one embodiment, control signals having predetermined voltages are initially applied during stage one to gate 114, source region 112 and drain region 108 (respectively) of vertical transistor 104 of memory cell 102. The stage one control signals may result in an accumulation of minority carriers (not shown) in the electrically floating body 118.

As a result of the polarity (e.g., positive) of the control signal applied to the gate with the stage one control signals, any accumulation of minority carriers occurs under the gate 114 in the first portion 118a of the body region 118, in an area that is close to the interface between gate oxide or dielectric 116 and electrically floating body 118 as described above. Any minority carriers that accumulate are in the first portion 118a of the body region 118 as a result of the gate voltage, and thus do not accumulate in the second and third portion 118b and 118c of the body region 118. Therefore, the accumulated charge of the body region 118 is discontinuous with the source region 112 and drain region 108.

The potential difference between the source voltage and the drain voltage of the stage one control signals, however, is less than the threshold required to turn on vertical transistor 104. Consequently, no impact ionization takes place among particles in the body region 118 and no bipolar or source current is produced in the electrically floating body region 118. Thus, no excess of majority carriers are generated in the electrically floating body region 118 of vertical transistor 104 of memory cell 102.

Stage two control signals can be subsequently applied to the vertical transistor 104 when writing or programming logic "0" as described above. The stage two control signals are control signals having predetermined voltages applied to gate 114, source region 112 and drain region 108 (respectively) of vertical transistor 104 of memory cell 102 subsequent to stage one.

The polarity (e.g., negative) of the gate signal may result in any minority carriers that accumulate being removed from electrically floating body region 118 of vertical transistor 104 via one or more of the source region 112 and the drain region 108. Furthermore, a polarity of the gate signal (e.g., negative) causes any minority carriers remaining in the body region 118 to be trapped or "stored" near an outer surface of the first portion 118a of the body region 118. The result is an absence of excess majority carriers in the body region 118 so that, in this manner, the predetermined voltages of the stage one and stage two control signals program or write logic "0" in memory cell 102.

A logic "0" programming operation of an alternative embodiment includes a two stage control signal application during which the gate voltage is changed from a first voltage level to a second voltage level. In operation, when writing or programming logic "0", in this alternative embodiment, control signals having predetermined voltages (for example, Vg=0v, Vs=0v, and Vd=0v) are initially applied during stage one to gate 114, source region 112 and drain region 108 (respectively).

The voltage levels described here as control signals to implement the write operations are provided merely as examples, and the embodiments described herein are not limited to certain voltage levels. The control signals increase the potential of electrically floating body region 118 which "turns on", produces, causes and/or induces a source current in the transistor of the memory cell. In the context of a write operation, the source current generates majority carriers in the electrically floating body region which are then stored. In the context of a read operation, the data state may be determined primarily by, sensed substantially using and/or based substantially on the source current that is responsive to the read control signals and significantly less by the interface channel current component, which is less significant and/or negligible relatively to the bipolar component.

Accordingly, the voltage levels to implement write operations are merely examples of control signals. Indeed, the indicated voltage levels may be relative or absolute. Alternatively, the voltages indicated may be relative in that each voltage level, for example, may be increased or decreased by a given voltage amount (for example, each of the gate, source, and drain voltage may be increased or decreased by 0.5, 1.0, 2.0 volts, etc.) whether one or more of the voltages (for example, the source, drain or gate voltages) become or are positive and negative.

As described above, and in accordance with an embodiment, the memory cell 102 may be implemented in the memory cell or memory cell array. When a memory cell is implemented in a memory cell array configuration, it may be advantageous to implement a "holding" operation or condition to certain memory cells when programming one or more other memory cells of the array in order to improve or enhance the retention characteristics of such certain memory cells.

In this regard, the transistor of the memory cell may be placed in a "holding" state via application of control signals (having predetermined voltages) which are applied to the gate and the source and drain regions of the transistor of the memory cells which are not involved in the write or read operations. For example, such control signals provide, cause and/or induce majority carrier accumulation in an area that is close to the interface between gate oxide 116 and electrically floating body 118. In this embodiment, it may be preferable to apply a negative voltage to gate 114 where vertical transistor 104 is an N-channel type transistor. The proposed holding condition may provide enhanced retention characteristics.

In one embodiment, a data state of memory cell 102 may be read and/or determined by applying control signals having predetermined voltages to gate 114 and source region 112 and drain region 108 of vertical transistor 104. Such control signals, in combination, induce and/or cause a source current in memory cells that are programmed to logic "1" as described above. As such, sensing circuitry (for example, a cross-coupled sense amplifier), which is coupled to vertical transistor 104 (for example, drain region 108) of memory cell 102, senses the data state using primarily and/or based substantially on the source current. Notably, for those memory cells 102 that are programmed to logic "0", such control signals induce, cause and/or produce little to no source current (for example, a considerable, substantial or sufficiently measurable source current).

Thus, in response to read control signals, electrically floating body vertical transistor 104 generates a source current which is representative of the data state of memory cell 102. Where the data state is logic high or logic "1", electrically floating body transistor 114 provides a substantially greater source current than where the data state is logic low or logic "0". Moreover, vertical transistor 104 may provide little to no source current when the data state is logic low or logic "0". Data sensing circuitry determines the data state of the memory cell based substantially on the source current induced, caused and/or produced in response to the read control signals.

Voltage levels described here as control signals to implement the read operations are provided merely as examples, and the embodiments described herein are not limited to any voltage levels. Voltage levels may be relative or absolute. Alternatively, voltages may be relative in that each voltage level, for example, may be increased or decreased by a given voltage amount (for example, each voltage may be increased or decreased by a voltage amount) whether one or more of the voltages (for example, the source, drain or gate voltages) become or are positive and negative.

As described above with reference to FIGS. 1E-1F, electrically floating body transistor 114 includes a body region 118 configured to be electrically floating. The body region 118 includes a number of portions or regions that collectively define the electrically floating body 118. The vertical transistor 104 includes a gate 114 disposed about the first portion 118a of the body region 118. A source region 112 adjoins a second portion 118b of the body region 118, and a drain region 108 adjoins a third portion 118c of the body region 118; the second portion 118b and third portion 118c of the body region 118 each adjoin the first portion 118a. Consequently, the second portion 118b and third portion 118c of the body region function to "disconnect" any charge that may accumulate and/or any inversion channel that may form in the first portion 118a from one or more of the source and the drain of the vertical transistor 104 of a memory cell 102 in the array of memory cells.

In accordance with an embodiment, each vertical transistor 104 in the array of memory cells 100 can be fabricated such that the source region 112 and drain region 108 of a vertical transistor 104 oppose one another and are separated vertically or substantially vertically. For example, the vertical transistor 104 of a memory cell 102 can be fabricated such that the drain region 108 is located in a layer above the source region 112. In another example, a vertical transistor 104 of a memory cell 102 can be fabricated such that the source region 112 is located in a layer above the drain region 108 of an associated memory cell 102 (see FIG. 1G). According to the example of FIG. 1G, hole disturb effects can be reduced since the distance holes need to move to disturb is greater than the distance of a planar implementation and since hole concentration decreases exponentially with distance.

Additionally, while not being shown to scale in FIGS. 1A-1G, the gates 114 can be disposed about one or more portions of the drain region, source region 112, and/or body region 118. For example, a gate 114 can be fabricated to surround and/or encompass one or more portions of a body region 118, a portion of a drain region 108, and/or a portion of a source region 112 to provide desirable operation qualities, such as enhanced retention and/or reliability characteristics. Accordingly, each gate 114 can be configured about an active portion of an associated transistor 104.

In one exemplary configuration, a width or outer diameter of a gate 114 can be fabricated to be about eighty (80) nm, a height of a vertical transistor 104 can be fabricated to be about one hundred (100) nm, a thickness of the gate oxide region can be fabricated to be about fifty six (56) Angstroms, a spacing between unconnected vertical transistors (see separation between rows in FIG. 1C) can be fabricated to be about twenty (20) nm, a depth of an STI region can be fabricated to be about eighty (80) nm, a junction depth associated with a bit line and/or a source line can be fabricated to be about fifty (50) nm, and the height of a body region 118 or channel can be fabricated to be about fifty four (54) nm. Other dimensions can be implemented in addition to these exemplary dimensions in accordance with a desired implementation.

As shown in FIGS. 1A and 1C, and according to one embodiment, portions of memory cell gates of a row of memory cells can be used to implement a number of word lines (WL0-WL4). For this example, the word lines (WL0-WL4) can be fabricated by spacing portions of a memory cell (gates for this example) within the array of memory cells 100. Accordingly, gates 114 can be spaced in the horizontal or row direction to form one or more horizontally disposed word lines (WL0-WL4). The word lines (WL0-WL4) can be used to control a data state of one or more of the memory cells 102. Gates 114 can also be spaced in the vertical or column direction to separate and isolate the gates and associated word line(s) from other gates (an adjacent row of gates for this example).

Figure 1D:
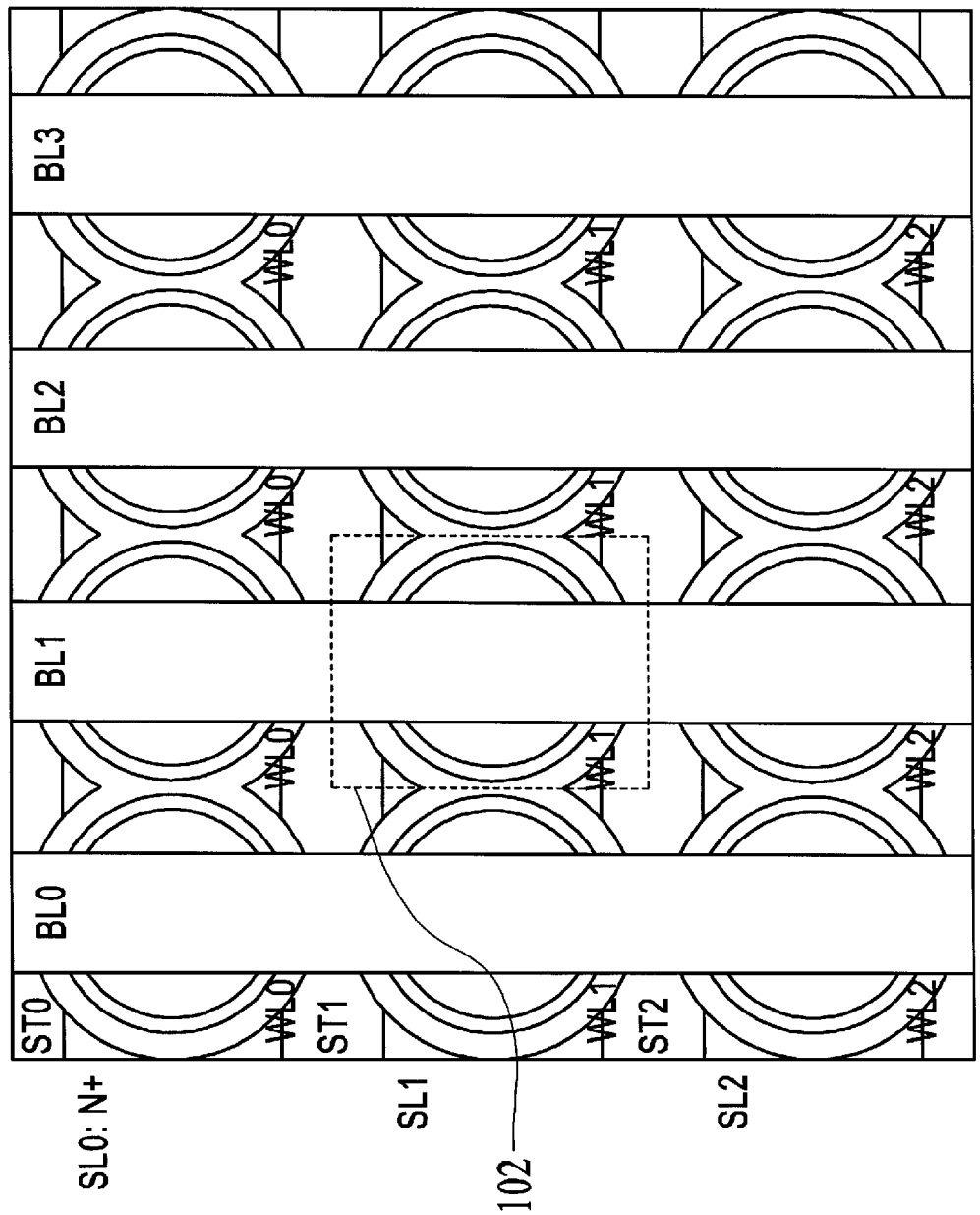
FIG. 1D depicts a cross-sectional view of a number of memory cells of the array of memory cells of FIG. 1A, under an embodiment.
Figure 1E:
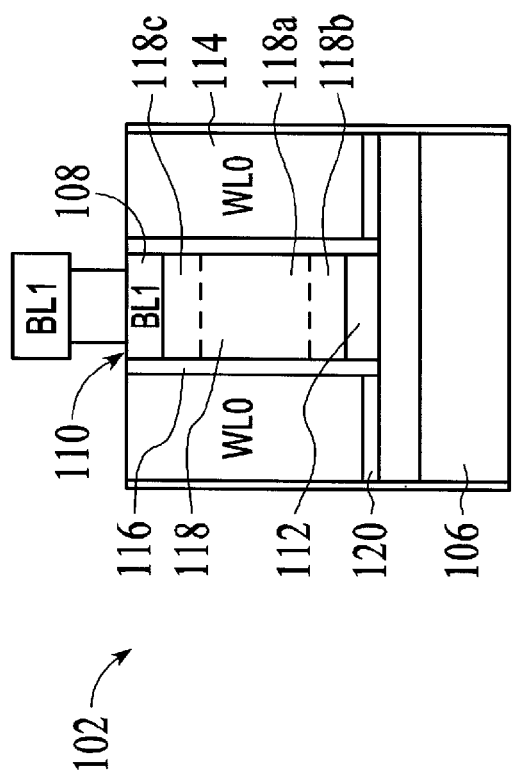
FIG. 1E depicts a cross-sectional view of a single memory cell of FIG. 1B, under an embodiment.
Figure 1F:
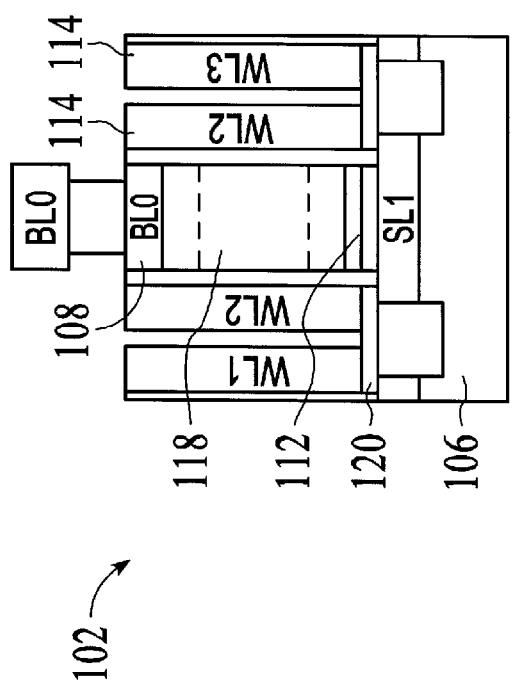
FIG. 1F depicts a cross-sectional view of a single memory cell of FIG. 1C, under an embodiment.
Figure 1G:
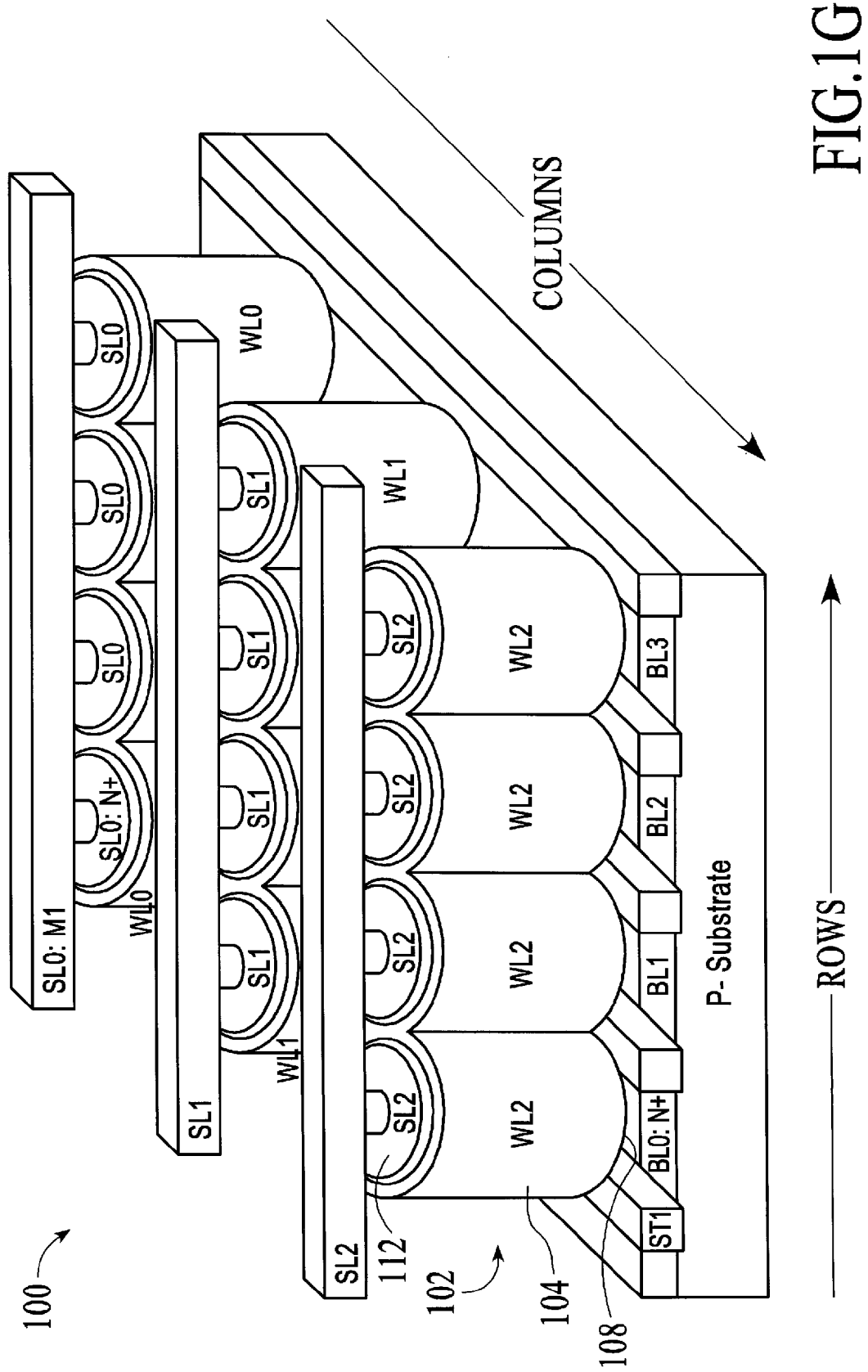
FIG. 1G depicts an array of memory cells that include electrically floating body transistors, under an embodiment.

As shown in top view of the array in FIG. 1D, the cross-sectional area of a memory cell 102 can be fabricated to be about $4F^2$ where F is the minimum feature size, but is not so limited. The shallow trench isolation (STI) regions (ST0-ST2) can assist to isolate portions of one memory cell from portions of another memory cell. For example, an STI region can be used to isolate each gate of a first row of gates from each gate of a second row of gates. Accordingly, a word line and other portions can be isolated by using a number of the STI regions. An oxide 120 can be disposed between a lower portion of each gate 114 of a vertical transistor 104 to further isolate each gate 114 and/or other cell portion from a source line, source region of an adjacent cell, etc. In one embodiment, the oxide 120 may be deposited or grown at the same time as the gate oxide region 116.

With continuing reference to the example of FIG. 1A, each row of memory cells can also be coupled to an associated source line (SL0-SL3) (e.g., implemented as N+ diffusion in this example). For example, source regions of a row of memory cells can be connected to an associated source line, wherein each source line can be used to control a data state of one or more memory cells. For this example, each source line and/or STI region can be fabricated to have a width that is about the width or diameter of a memory cell feature (e.g., a feature size). As shown in FIG. 1D, source lines SL0-SL3 are also separated and isolated from one another by STI regions ST0-ST2. In one embodiment, as shown in the example of FIG. 1B, the STI regions ST0-ST2 can be fabricated to have depths that extend beyond a depth of one or more associated source lines. As one result of such an exemplary configuration of a memory cell 102 in the array of memory cells 100, source line disturb effects may be reduced and/or eliminated since each row of memory cells includes a dedicated source line diffusion.

As shown in the examples of FIGS. 1A-1D, a column of memory cells in the array can be coupled to an associated bit line (BL0-BL3). As shown in FIG. 1A, a first write line (WL0) can be associated with a first row of memory cells, a second write line (WL1) can be associated with a second row of memory cells, etc., and a first bit line (BL0) can be associated with a first column of memory cells, a second bit line (BL1) can be associated with a second column of memory cells, etc. For this example, the bit lines are coupled to drain regions of vertical transistors BL0-BL3 and run perpendicular or substantially perpendicular to the word lines (WL0-WL4) and/or source lines SL0-SL3. In one embodiment, each bit line comprises a type of metal (e.g., aluminum, silver, gold, etc.), and the bit lines of a memory cell array can be fabricated to be electrically isolated from one another (see FIGS. 1A, 1B, and 1C) and can also be used to control one or more data states of a memory cell. In various embodiments, ion implantation and other fabrication methods can be used to form a vertical transistor of the memory cell array. While a certain number and configurations of memory cells are shown in FIGS. 1A-1G, embodiments can include other numbers and/or configurations of memory cells.

Figure 2:
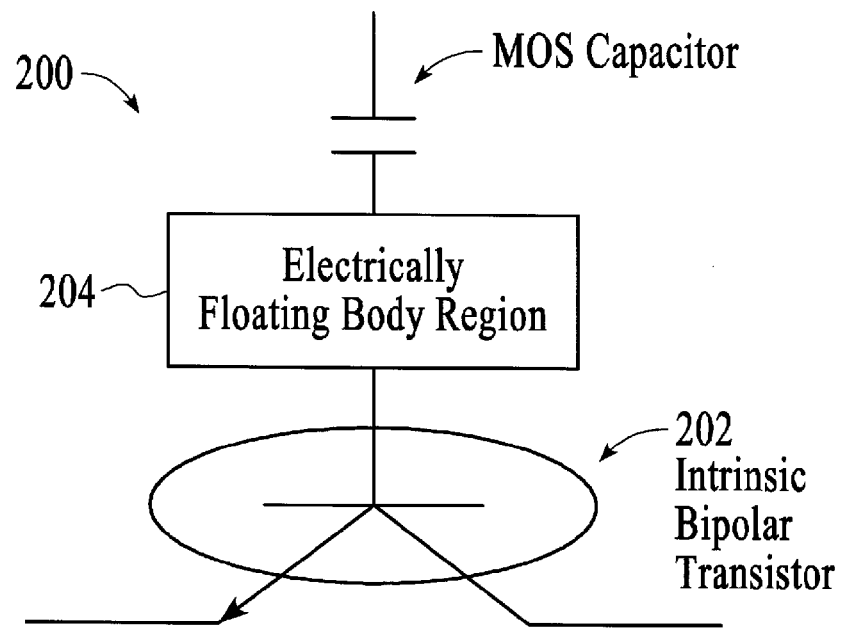
FIG. 2 is a schematic depicting an electrically floating body transistor, under an embodiment.

FIG. 2 is an electrically floating body transistor 200 schematically illustrated as including a MOS capacitor "component" and an intrinsic bipolar transistor "component" 202, under an embodiment. In one aspect, the present inventions employ the intrinsic bipolar transistor "component" 202 to implement an operation, such as a program/write operation, a read operation, etc. of a memory cell. For example, the intrinsic bipolar transistor 202 generates and/or produces a source or bipolar transistor current which is employed to program/write a data state in the memory cell and/or read a data state of one or more memory cells. Notably, in this example embodiment, electrically floating body transistor 200 includes an electrically floating body region 204 and can be configured as an N-channel device. As such, majority carriers are "holes".

The bipolar transistor 202 of an embodiment includes a floating body, meaning the potential is not fixed but is "floating". The potential for example depends on the charge at an associated gate. Any base of the transistor 200 in this embodiment, however, is floating and not fixed because there is no base contact as found in conventional bipolar BJTs; the current in this transistor is therefore referred to herein as a "source" current produced by impact ionization in the body region as described below.

Figure 3:
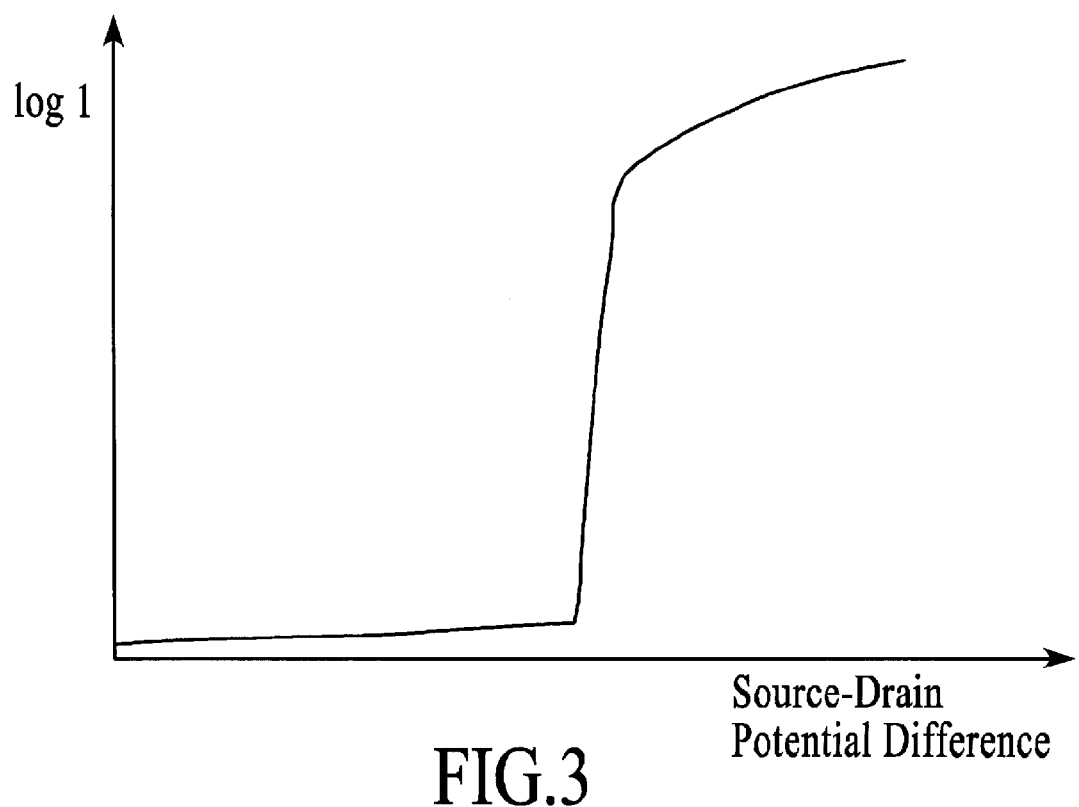
FIG. 3 is an example characteristic curve of electrically floating body transistor, under an embodiment.

FIG. 3 is an example characteristic curve of an electrically floating body transistor, under an embodiment. For example, the characteristic curve can correspond to the electrically floating body transistor 200 of FIG. 2 and shows a significant increase in source current (e.g., "log I") at and above a specific threshold value of a potential difference between an applied source voltage and applied drain voltage ("source-drain potential difference"). Accordingly, a voltage differential at or above a certain threshold generates a high electric field in the body region of an associated electrically floating body transistor.

In one embodiment, the high electric field results in impact ionization in a first portion of a body region of an associated bit or memory cell. Impact ionization is a process during which electrons or charge carriers with enough energy generate majority carriers, such as holes for example. The impact ionization drives majority carriers to the body region, which increases the body potential, while any minority carriers flow to the drain (or source) region. The increased body potential results in an increase in source current in the body region; thus, the excess majority carriers of the body region generate source current, which can be used as part of an operation of the associated memory cell of an embodiment.

Figure 4:
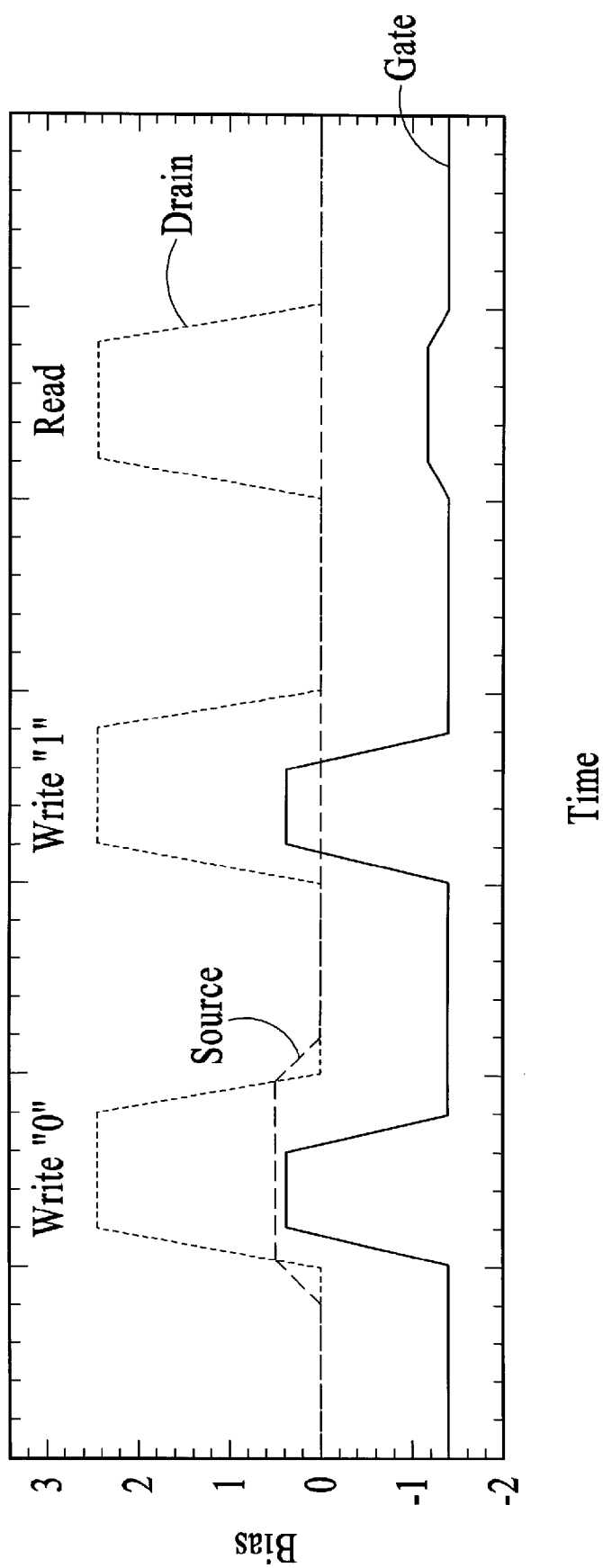
FIG. 4 is a plot of voltage levels versus time for examples of each of write "0", write "1", and read operations, under an embodiment.

FIG. 4 is a plot of voltage levels versus time for examples of each of write "0", write "1", and read operations, under an embodiment. These examples are described in detail above. The voltage levels for each of the source and drain are interchangeable as a result of the MOSFET being a symmetrical device; therefore, voltage levels shown or described herein as applied to the source can be applied to the drain, while voltage levels shown or described herein as applied to the drain can be applied to the source.

Figure 5:
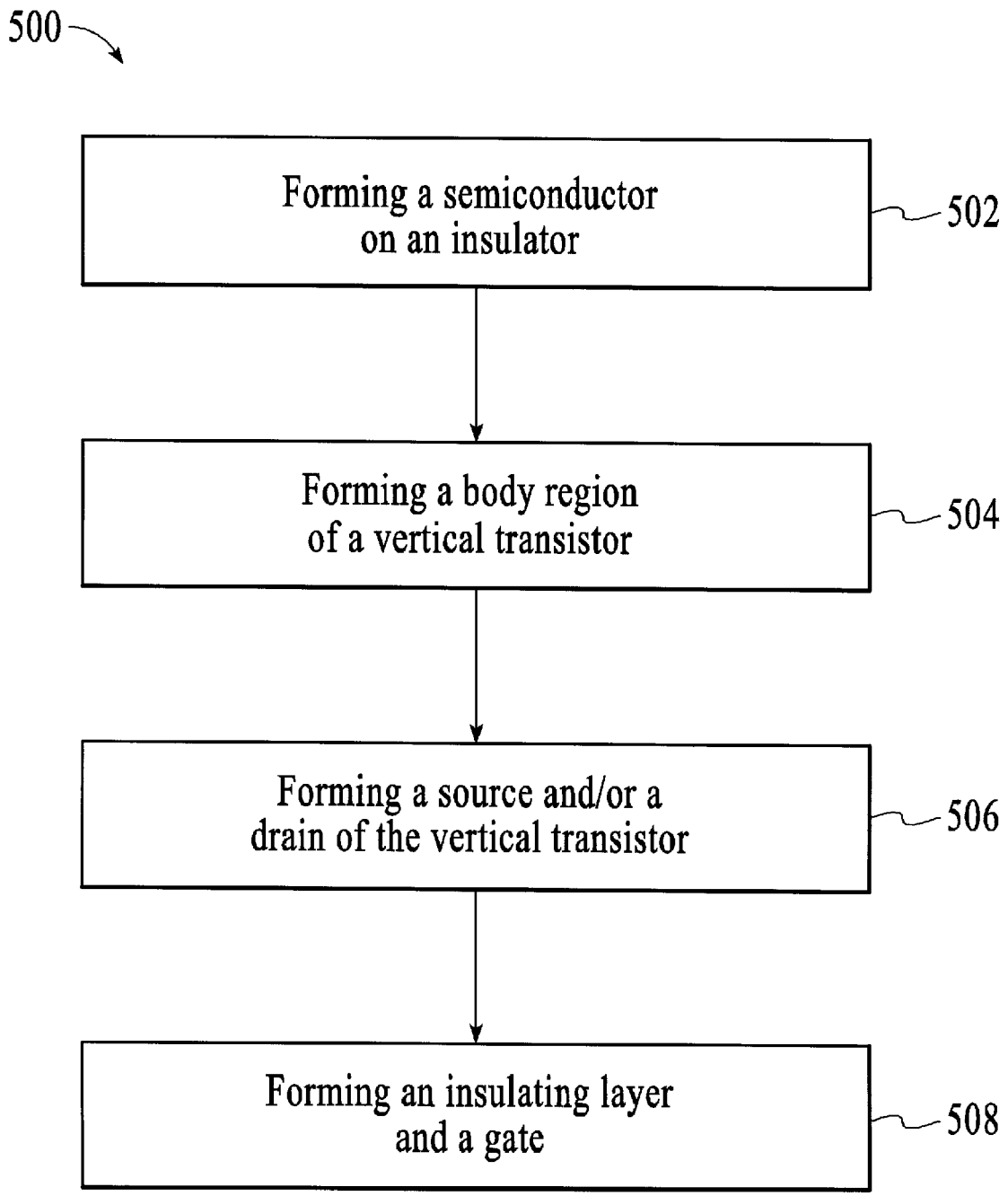
FIG. 5 is a flow diagram for forming a transistor, under an embodiment.

FIG. 5 is a flow diagram for forming a vertical transistor 500, under an embodiment. The vertical transistor is formed, generally, by forming 502 a semiconductor on an insulator. For example, semiconductor layers can be patterned and etched to form a pillar-like transistor having vertically separated drain and source regions, but is not so limited. At 504, and according to an embodiment, a body region of the vertical transistor can be formed to define a first portion, second portion, and third portion of the semiconductor which collectively form the floating body region. The portions can be shaped and sized according to a desired implementation.

At 506, depending in part on an implementation, the process of forming the vertical transistor includes forming a source and/or a drain about a body portion of the vertical transistor. For example, ion implantation can be used to form a pillar-like transistor structure having N+ source and drain regions located at opposing ends of the pillar. At 508, an insulating layer and a gate can be formed about a portion of the semiconductor. For example, a gate oxide and a gate can be formed, wherein the gate is disposed to surround one or more of an electrically floating body region, a source, and/or a drain.

Moreover, doping profiles that result in creation of the source and/or drain region can be configured according to various embodiments so that a body region includes the second and/or third portions and thus extends beyond an extended boundary of the gate. The second and/or third portions of the body region function to prevent any inversion channel formation through the entire body region of the device because the area of the body region in which the channel forms under the gate is not continuous with the source and drain regions, as described above. Therefore, upon application of a gate voltage that is appropriate to material of the body region, charge accumulates in the body region of the device, but current cannot flow between the source and drain regions because no inversion channel is formed between the source and/or drain and any accumulated charge is disconnected from the source and/or drain.

Transistor devices of various alternative embodiments can provide a discontinuous region of any accumulated charge in the body by disconnecting the first portion of the body as described herein at the source region, the drain region, or both the source and drain regions. Further, various doping densities (e.g., very light, light, high, and very high doping) and/or profiles can be used in the source, body, and drain regions of the vertical transistor.

A number of examples follow of various alternative embodiments. In one example, an electrically floating body vertical transistor in which a first portion of the body region is made discontinuous with only the drain by a third portion of the body region. Another example includes an electrically floating body vertical transistor in which a first portion of the body region is made discontinuous with only the drain by a third portion of the body region. Under an embodiment, the source region includes a highly-doped (HD) portion and a lightly-doped (LD) portion. Yet another example includes an electrically floating body vertical transistor in which a first portion of the body region is made discontinuous with only the source by a second portion of the body region. Under an embodiment, the drain region includes a highly-doped portion and a lightly-doped portion.

Another example includes an electrically floating body transistor in which a first portion of the body region is made discontinuous with both the source and drain regions. Under an embodiment, each of the source and drain regions comprise LD and/or HD portions. Under another embodiment, each of the source and drain regions comprise LD portions. In one embodiment, each of the source and drain regions comprise HD portions. Under yet another embodiment, the source region is LD and the drain region is HD. In another embodiment, the source region is HD and the drain region is LD.

As described above, in contrast to conventional devices, the various embodiments described herein for a vertical transistor produce a relatively lower potential difference between the source and drain regions during write operations. The lower potential difference results from the device configuration described above which includes an increased distance between the source and drain regions resulting from the configuration (e.g., size, shape, etc.) of the source and drain regions relative to the gate region.

The embodiments described herein may be implemented in an integrated circuit (IC) device (for example, a discrete memory device or a device having embedded memory) including a memory array having a plurality of memory cells arranged in a plurality of rows and columns wherein each memory cell includes an electrically floating body transistor. The memory arrays may comprise N-channel, P-channel and/or both types of vertical transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

The present inventions may be implemented in any architecture, layout, and/or configuration comprising memory cells having electrically floating body transistors. For example, in one embodiment, a memory array including a plurality of memory cells having a separate source line for each row of memory cells (a row of memory cells includes a common word line connected to the gates of each memory cell of the row). The memory array may employ one or more of the example programming, reading, refreshing and/or holding techniques described above.

In one embodiment, the present inventions are implemented in conjunction with a two step write operation whereby all the memory cells of a given row are written to a predetermined data state by first executing a "clear" operation, whereby all of the memory cells of the given row are written or programmed to logic "0", and thereafter selected memory cells of the row are selectively written to the predetermined data state (here logic "1"). The present inventions may also be implemented in conjunction with a one step write operation whereby selected memory cells of the selected row are selectively written or programmed to either logic "1" or logic "0" without first implementing a "clear" operation.

As mentioned above, the source current responsible for impact ionization and/or avalanche multiplication in the floating body can be initiated or induced by the control signal (control pulse) applied to the gate of the vertical transistor. Such a signal/pulse may induce the channel impact ionization which raises or increases the potential of the electrically floating body region of the vertical transistor of a memory cell or cells and "turns-on" and/or produces a source current in the associated vertical transistor. One advantage of the proposed method is that a large amount of the excess majority carriers may be generated and stored in the electrically floating body region of the vertical transistor that is associated with a memory cells.

The programming, reading, and other techniques described herein may be used in conjunction with a plurality of memory cells arranged in an array of memory cells. A memory array implementing the structure and techniques of the present inventions may be controlled and configured including a plurality of memory cells having a separate source line for each row of memory cells (a row of memory cells includes a common word line and a column of memory cells includes a common bit line). The memory array may use any of the example programming, reading, refreshing, and/or holding techniques described herein. The memory arrays may comprise N-channel, P-channel and/or both types of vertical transistors. Circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells in the memory array(s), suitable write and read voltages (for example, negative voltages) are well known to those skilled in the art in light of this disclosure.

The present inventions may be implemented in any electrically floating body memory cell and memory cell array. For example, in certain aspects, the present inventions are directed to a memory array, having a plurality of memory cells each including an electrically floating body transistor, and/or technique of programming data into and/or reading data from one or more memory cells of such a memory cell array. In this aspect of the inventions, the data states of adjacent memory cells and/or memory cells that share a word line may or may not be individually programmed.

Figure 6A:
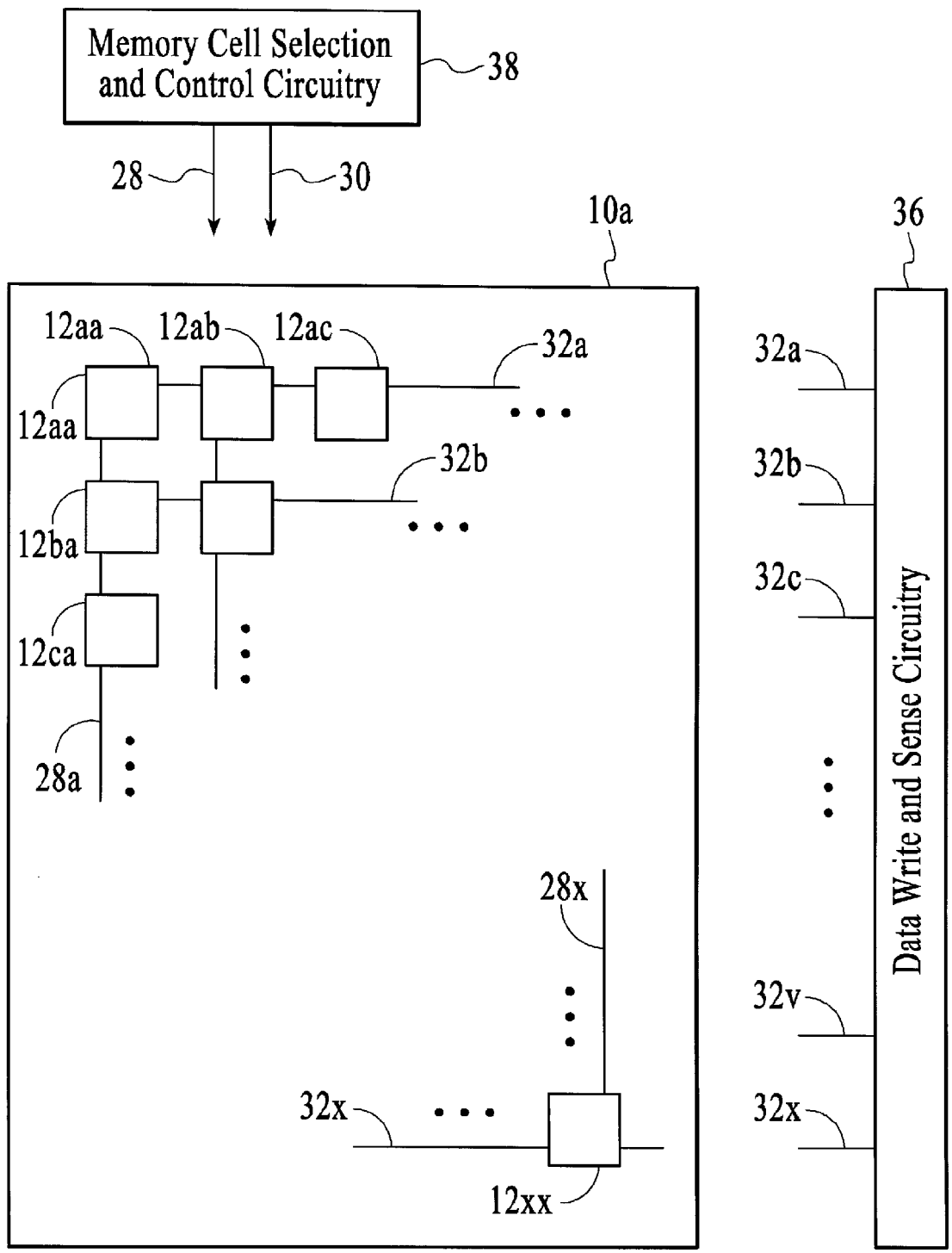
FIGS. 6A and 6B are schematic block diagrams of embodiments of an integrated circuit device, according certain aspects of the present inventions.
Figure 6B:
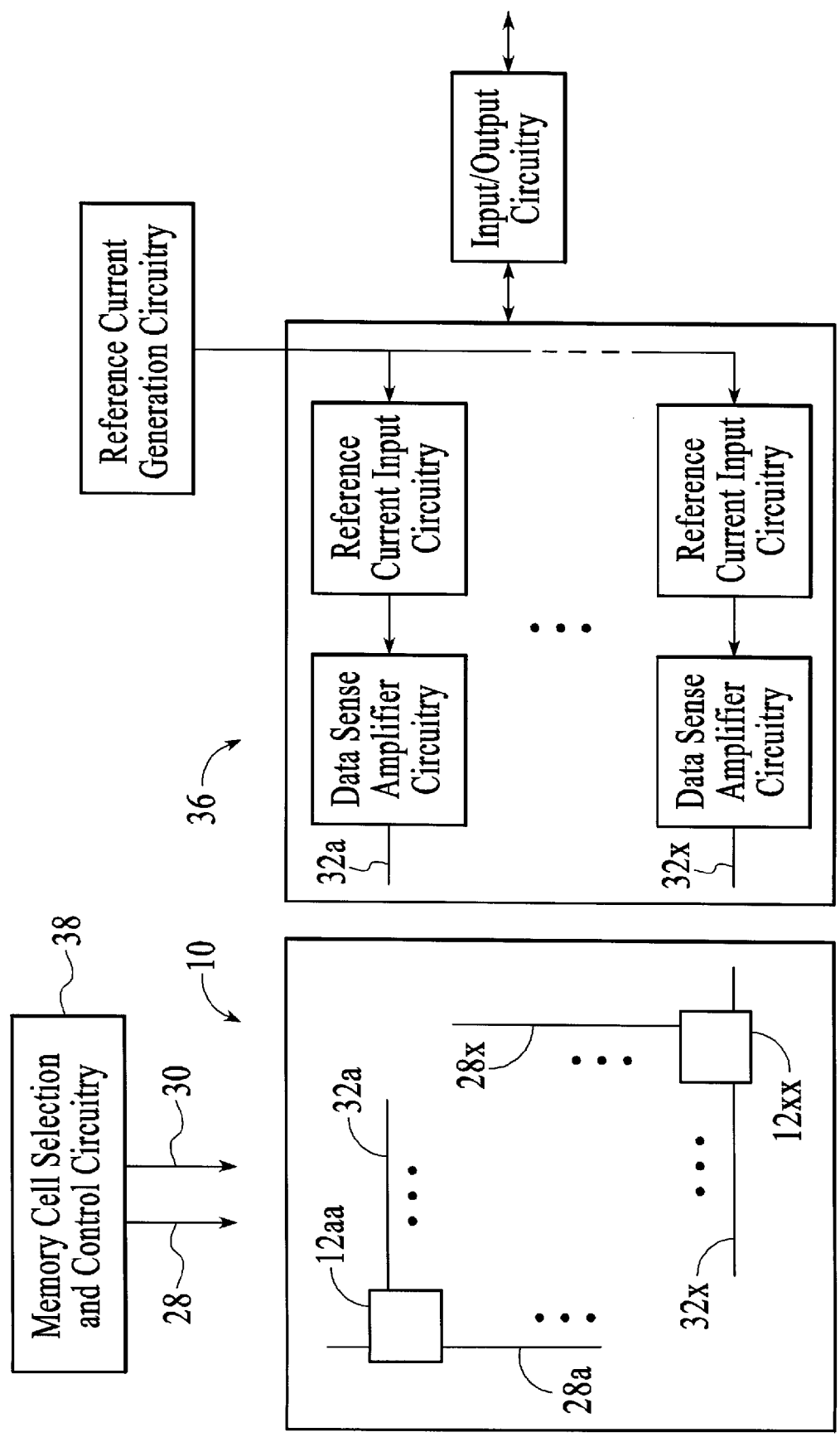

As shown in FIGS. 6A-6B, an integrated circuit device may include array 10, having a plurality of memory cells 12, data write and sense circuitry 36, and memory cell selection and control circuitry 38. The data write and sense circuitry 36 reads data from and writes data to selected memory cells 12. In one embodiment, data write and sense circuitry 36 includes a plurality of data sense amplifiers. Each data sense amplifier receives at least one bit line 32 and an output of reference generator circuitry (for example, a current or voltage reference signal). In one embodiment, the data sense amplifier may be a cross-coupled type sense amplifier to sense the data state stored in memory cell 12 and/or write-back data into memory cell 12.

The data sense amplifier may employ voltage and/or current sensing circuitry and/or techniques. In the context of current sensing, a current sense amplifier may compare the current from the selected memory cell to a reference current, for example, the current of one or more reference cells. From that comparison, it may be determined whether memory cell 12 contained logic high (relatively more majority carriers contained within body region 18) or logic low data state (relatively less majority carriers contained within body region 18). Notably, the present inventions may employ any type or form of data write and sense circuitry 36 (including one or more sense amplifiers, using voltage or current sensing techniques, to sense the data state stored in memory cell 12) to read the data stored in memory cells 12 and/or write data in memory cells 12.

Memory cell selection and control circuitry 38 selects and/or enables one or more predetermined memory cells 12 to facilitate reading data from and/or writing data to the memory cells 12 by applying a control signal on one or more word lines 28. The memory cell selection and control circuitry 38 may generate such control signals using address data, for example, row address data. Indeed, memory cell selection and control circuitry 38 may include a conventional word line decoder and/or driver. There are many different control/selection techniques (and circuitry) to implement the memory cell selection technique. Such techniques, and circuitry, are well known to those skilled in the art. All such control/selection techniques, and circuitry, whether now known or later developed, are intended to fall within the scope of the present inventions.

For example, the electrically floating body transistor, which programmed (written to), read, refreshed, and/or controlled using the techniques of the present inventions, may be employed in any electrically floating body memory cell, and/or memory cell array architecture, layout, structure and/or configuration employing such electrically floating body memory cells. Indeed, all memory cell selection and control circuitry for programming, reading, refreshing, controlling and/or operating memory cells including electrically floating body transistors, whether now known or later developed, are intended to fall within the scope of the present inventions.

Moreover, the data write and data sense circuitry may include a sense amplifier (not illustrated in detail herein) to read the data stored in memory cells 12. The sense amplifier may sense the data state stored in memory cell 12 using voltage or current sensing circuitry and/or techniques. In the context of a current sense amplifier, the current sense amplifier may compare the cell current to a reference current, for example, the current of a reference cell (not illustrated). From that comparison, it may be determined whether memory cell 12 contained logic high (relatively more majority carriers contained within body region 18) or logic low data state (relatively less majority carriers contained within body region 18). Such circuitry and configurations thereof are well known in the art.

The electrically floating memory cells, transistors and/or memory array(s) may be fabricated using well known techniques and/or materials. Indeed, any fabrication technique and/or material, whether now known or later developed, may be employed to fabricate the electrically floating memory cells, transistors and/or memory array(s). For example, the present inventions may employ silicon, germanium, silicon/germanium, gallium arsenide or any other semiconductor material (whether bulk-type or SOI) in which transistors may be formed. As such, the electrically floating memory cells may be disposed on or in (collectively "on") a SOI-type substrate or a bulk-type substrate.

Memory array 10 (including SOI memory transistors) further may be integrated with SOI logic transistors, as described and illustrated in the Integrated Circuit Device Patent Applications. For example, in one embodiment, an integrated circuit device includes memory section (having, for example, partially depleted (PD) or fully depleted (FD) SOI memory transistors 14) and logic section (having, for example, high performance transistors, multiple gate transistors, and/or non-high performance transistors (for example, single gate transistors that do not possess the performance characteristics of high performance transistors).

Further, memory array(s) 10 may comprise N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include FD-type transistors (whether P-channel and/or N-channel type). Alternatively, such circuitry may include PD-type transistors (whether P-channel and/or N-channel type). There are many techniques to integrate both PD and/or FD-type transistors on the same substrate. All such techniques, whether now known or later developed, are intended to fall within the scope of the present inventions. Where P-channel type transistors are employed as memory cells 12 in the memory array(s), suitable write and read voltages (for example, negative voltages) are well known to those skilled in the art in light of this disclosure.

Notably, electrically floating body vertical transistor may be a symmetrical or non-symmetrical device. Where vertical transistor is symmetrical, the source and drain regions are essentially interchangeable. However, where vertical transistor is a non-symmetrical device, the source or drain regions of vertical transistor have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

As mentioned above, the illustrated/example voltage levels to implement the read and write operations are merely examples. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the source, drain or gate voltages) become or are positive or negative.

The illustrated/example voltage levels and/or timing to implement the write and read operations are merely examples. In this regard, in certain embodiments, the control signals increase the potential of electrically floating body region of the transistor of the memory cell which "turns on" or produces a source current in the transistor. In the context of a write operation, the source current generates majority carriers in the electrically floating body region which are then stored. In the context of a read operation, the data state may be determined primarily by, sensed substantially using and/or based substantially on the source current that is responsive to the read control signals and significantly less by the interface channel current component, which is less significant and/or negligible relative to the bipolar component.

Aspects of the present inventions described herein, and/or embodiments thereof, may include an integrated circuit device. The IC device of an embodiment comprises a memory cell consisting essentially of one vertical transistor including an electrically floating body region that includes a gate disposed about a first boundary of the body region, a drain region adjoining a second boundary of the body region, the second boundary adjacent the first boundary and separating the drain region from the first boundary, and, a source region vertically separated from the drain region and adjoining a third boundary of the body region, the third boundary adjacent the first boundary and separating the source region from the first boundary.

The device of an embodiment includes an insulating region adjoining the body region and isolating the body region from the gate.

The device of an embodiment includes an insulating region that comprises an oxide.

The device of an embodiment includes an insulating region surrounding a portion of one of a drain region and source region.

The device of an embodiment includes a gate surrounding a portion of an insulating region and a portion of one of a drain region and source region.

The device of an embodiment includes a gate surrounding an insulating region and a portion of one of a body region, drain region, and source region.

The device of an embodiment includes a gate surrounding an insulating region, a body region, and one of a drain region and source region.

The device of an embodiment includes a source region disposed below a third boundary of a body region.

The device of an embodiment includes a source region coupled to a source line.

The device of an embodiment includes a source region disposed above a second boundary of a body region.

The device of an embodiment includes a source region coupled to a source line.

The device of an embodiment includes a drain region disposed above a second boundary of a body region.

The device of an embodiment includes a drain region coupled to a bit line.

The device of an embodiment includes a drain region disposed below a third boundary of a body region.

The device of an embodiment includes a drain region coupled to a bit line.

The device of an embodiment includes a drain region disposed in a layer above and spaced apart from a source region layer.

The device of an embodiment includes a drain region disposed in a layer below and spaced apart from a source region layer.

The device of an embodiment includes a body region comprising a core region, the source and drain regions disposed above and below the core region, and an insulating layer encompassing a portion of one or more of the core region, the source region, and drain region.

The device of an embodiment includes a body region comprising a core region, source and drain regions opposite one another and in separate planes about the core region, and an insulating layer surrounding portions of the core region, source region, and drain region.

The device of an embodiment includes a substantially cylindrically configured transistor.

The device of an embodiment includes a vertical channel transistor.

The device of an embodiment includes a first voltage coupled to a gate, wherein the first voltage may cause minority carriers to accumulate in a body region.

The device of an embodiment wherein minority carriers accumulate at a surface region of a body region adjacent to a gate dielectric which is disposed between the gate and a first boundary of the body region.

The device of an embodiment wherein a region that includes minority carriers is disconnected from a source region by a portion of a third boundary of a body region.

The device of an embodiment wherein a region that includes minority carriers is disconnected from a drain region by a portion a second boundary of a body region.

The device of an embodiment wherein a region that includes minority carriers is disconnected from a source region by a portion of a second boundary of a body region.

The device of an embodiment wherein a region that includes minority carriers is disconnected from a drain region by a portion a third boundary of a body region.

The device of an embodiment includes a first potential difference coupled between a source and a drain, the first potential difference generating source current as a result of impact ionization of minority carriers.

The device of an embodiment includes a second voltage coupled to a gate after and instead of a first voltage, the second voltage causing an accumulation of majority carriers in a body region, wherein the majority carriers result in a first data state which is representative of a first charge in the body region.

The device of an embodiment includes a second potential difference coupled between a source and a drain, the second potential difference resulting in a second data state which is representative of a second charge in a body region.

The device of an embodiment includes a body region having a first type of semiconductor material which can be either un-doped or doped.

The device of an embodiment includes a source region and drain region having a second type of semiconductor material.

The device of an embodiment includes a source region having a lightly doped region.

The device of an embodiment includes a source region having a highly doped region.

The device of an embodiment includes a source region having a lightly doped region and a highly doped region.

The device of an embodiment includes a drain region includes a lightly doped region.

The device of an embodiment includes a drain region includes a highly doped region.

The device of an embodiment includes a drain region includes a lightly doped region and a highly doped region.

The device of an embodiment includes a bit line coupled to a drain region.

The device of an embodiment includes a source line coupled to a source region.

The device of an embodiment includes a bit line coupled to adjacent drain regions such that hole diffusion between adjacent cells is reduced during a write operation.

The device of an embodiment includes a gate which comprises a write line associated with an adjacent gate.

Aspects of the present inventions described herein, and/or embodiments thereof, may include an integrated circuit device. The IC device of an embodiment comprises a memory cell consisting essentially of one vertical transistor including an electrically floating body region that includes a gate, a body region configured as an electrically floating body, the body region configured so that material forming the body region extends beyond at least one vertical boundary of the gate, and a source region and a drain region adjacently disposed to the body region in opposing planes.

Aspects of the present inventions described herein, and/or embodiments thereof, may include an integrated circuit device. The IC device of an embodiment comprises a memory cell consisting essentially of one vertical transistor including an electrically floating body region that includes a source region disposed on an insulating substrate, a floating body region disposed over the source region, a drain region disposed over the floating body region and opposing the source region, and, a gate encompassing the floating body region and a portion of one or more of the source region and drain region, wherein a doping profile of one or more of the source and the drain region is configured to prevent formation of a contiguous current channel extending between the source region and the drain region through the floating body region.

Aspects of the present inventions described herein, and/or embodiments thereof, may include an integrated circuit device. The IC device of an embodiment comprises a memory cell consisting essentially of one vertical transistor that can be formed by: forming a source region by implanting an impurity into a first portion of a semiconductor, forming a floating body region over the source region, wherein the floating body includes a pillar structure and defines a vertical channel, forming an insulating layer and a gate to encompass the floating body region, wherein the insulating layer is disposed between the gate and the floating body region, and, forming a drain region by implanting the impurity into a second portion of the semiconductor adjacent to the floating body region, wherein the drain region is formed to oppose the source region vertically.

The method of an embodiment comprising forming a floating body region using a first type of semiconductor material which can be either un-doped or doped.

The method of an embodiment comprising forming a source region and drain region using a second type of semiconductor material that is different from a first type.

The method of an embodiment comprising implanting an impurity into a first portion includes implanting to form a lightly doped source region.

The method of an embodiment comprising implanting an impurity into a first portion includes implanting to form a highly doped source region.

The method of an embodiment comprising implanting an impurity into a first portion includes implanting to form a source region that includes both a lightly doped source portion and a highly doped source portion.

The method of an embodiment comprising implanting an impurity into a second portion includes implanting to form a lightly doped drain region.

The method of an embodiment comprising implanting an impurity into a second portion includes implanting to form a highly doped drain region.

The method of an embodiment comprising implanting an impurity into a second portion includes implanting to form a drain region that includes both a lightly doped drain portion and a highly doped drain portion.

A semiconductor device produced by a method, the semiconductor device comprising: a body region configured to be electrically floating, wherein the body region includes an outer surface, a lower surface, and an upper surface, a gate surrounding the outer surface of the body region, a source region adjoining the lower surface of the body region, and, a drain region adjoining the upper surface of the body region.

A semiconductor device produced by a method, the semiconductor device comprising: a body region configured to be electrically floating, wherein the body region includes an outer surface, a lower surface, and an upper surface, a gate surrounding the outer surface of the body region, a drain region adjoining the lower surface of the body region, and, a source region adjoining the upper surface of the body region.

Aspects of the present inventions described herein, and/or embodiments thereof, may include an integrated circuit device. The IC device of an embodiment comprises a memory cell including a transistor, the transistor comprising a body region configured to be electrically floating, a gate disposed about a first boundary of the body region, a drain region adjoining a second boundary of the body region, the second boundary adjacent the first boundary and separating the drain region from the first boundary, and, a source region vertically separated from the drain region and adjoining a third boundary of the body region, the third boundary adjacent the first boundary and separating the source region from the first boundary, wherein the memory cell includes a first data state representative of a first charge in the body region, wherein the memory cell includes a second data state representative of a second charge in the body region, wherein first write control signals can be applied to the memory cell to write the first data state and second write control signals to the memory cell to write the second data state, wherein, in response to first write control signals, the electrically floating body transistor generates a first source current which substantially provides the first charge in the body region.

An integrated circuit device under an embodiment wherein first write control signals cause, provide, produce and/or induce the first source current.

An integrated circuit device under an embodiment wherein first write control signals include a signal applied to a gate and a signal applied to a source region, wherein the signal applied to the gate includes a first voltage having a first amplitude and a second voltage having a second amplitude.

An integrated circuit device under an embodiment wherein first write control signals include a signal applied to a gate and a signal applied to a drain region, wherein the signal applied to the gate includes a first voltage having a first amplitude and a second voltage having a second amplitude.

An integrated circuit device under an embodiment wherein first write control signals include a potential difference applied between a source region and a drain region.

An integrated circuit device under an embodiment wherein first write control signals include a signal applied to a gate, wherein the signal applied to the gate includes a first voltage having a first amplitude and a second voltage having a second amplitude.

An integrated circuit device under an embodiment wherein first write control signals include a signal applied to a gate, a signal applied to a source region, and a signal applied to the drain region to cause, provide, produce and/or induce the first source current, wherein the signal applied to the source region includes a first voltage having a first amplitude, the signal applied to the drain region includes a second voltage having a second amplitude, and the signal applied to the gate includes a third voltage having a third amplitude and a fourth voltage having a fourth amplitude.

An integrated circuit device under an embodiment wherein first write control signals include a first potential difference applied between a source region and a drain region and a signal applied to a gate that includes a third voltage, wherein the first write control signals may cause, provide, produce and/or induce an accumulation of minority carriers in a first portion of a body region.

An integrated circuit device under an embodiment wherein minority carriers accumulate at a surface region of a body region that is juxtaposed or near a gate dielectric which is disposed between a gate and the body region.

An integrated circuit device under an embodiment wherein first write control signals cause, provide, produce and/or induce current in a body region as a result of impact ionization induced by minority carriers.

An integrated circuit device under an embodiment wherein a signal applied to a gate temporally changes to a fourth voltage that causes, provides, produces and/or induces an accumulation of majority carriers in a first portion of a body region, wherein the majority carriers result in a first data state.

An integrated circuit device under an embodiment wherein second write control signals include a second potential difference applied between a source region and a drain region and a signal applied to a gate that includes a third voltage, wherein the second write control signals prevent a first data state from being written into the body transistor.

An integrated circuit device under an embodiment wherein an applied second potential difference is relatively less than a first potential difference.

An integrated circuit device under an embodiment wherein in response to read control signals applied to a memory cell, a vertical channel transistor generates a second source current which is representative of a data state of the memory cell.

An integrated circuit device under an embodiment wherein read control signals include a signal applied to a gate, source region, and drain region to cause, force and/or induce the source current which is representative of a data state of a memory cell of the device.

An integrated circuit device under an embodiment wherein read control signals include a first potential difference applied between a source region and drain region.

An integrated circuit device under an embodiment comprising a bit line coupled to a drain region.

An integrated circuit device under an embodiment comprising a source line coupled to a source region.

An integrated circuit device under an embodiment including a bit line coupled to adjacent drain regions such that hole diffusion between adjacent cells is reduced during a memory operation.

Aspects of the present inventions described herein, and/or embodiments thereof, may include an integrated circuit device. The IC device of an embodiment comprises a memory cell array including a plurality of word lines, plurality of source lines, plurality of bit lines, and plurality of memory cells arranged in a matrix of rows and columns, wherein each memory cell includes a transistor comprising a body region configured to be electrically floating, a gate disposed about a first boundary of the body region, the gate coupled to an associated word line, a drain region adjoining a second boundary of the body region, the second boundary adjacent the first boundary and separating the drain region from the first boundary, the drain region coupled to an associated bit line, and, a source region vertically separated from the drain region and adjoining a third boundary of the body region, the third boundary adjacent the first boundary and separating the source region from the first boundary, the source region coupled to an associated source line, wherein each memory cell includes a first data state representative of a first charge in the body region, wherein each memory cell includes a second data state representative of a second charge in the body region, wherein the drain region of each memory cell of a first column of memory cells is connected to a first bit line, wherein the source region of each memory cell of a first row of memory cells is connected to a first source line, wherein, in response to first write control signals applied to at least a portion of the memory cells of the first row of memory cells, the electrically floating body transistor of each memory cell of the portion of the memory cells of the first row of memory cells generates a first source current which at least substantially provides the first charge in the body region of the electrically floating body transistor of the portion of the memory cells of the first row of memory cells.

An integrated circuit device under an embodiment including a bit line comprising a metal and coupled to drain regions of a row of memory cells to reduce hole disturb to adjacent memory cells.

An integrated circuit device under an embodiment wherein a source region of each memory cell of a second row of memory cells is connected to a second source line.

An integrated circuit device under an embodiment wherein a drain region of each memory cell of a second column of memory cells is connected to a second bit line.

An integrated circuit device under an embodiment wherein a source region of each memory cell of a second row of memory cells is connected to a second source line, drain region of each memory cell of a second column of memory cells connected to a second bit line, the source region of each memory cell of a third row of memory cells connected to a third source line, wherein the second and third rows of memory cells are adjacent to the first row of memory cells, and, the drain region of each memory cell of a third column of memory cells connected to a third bit line, wherein the second and third columns of memory cells are adjacent to the first column of memory cells.

An integrated circuit device under an embodiment wherein first write control signals cause, provide, produce and/or induce first source current.

An integrated circuit device under an embodiment wherein first write control signals include a signal applied to a gate and a signal applied to a source region, wherein the signal applied to the gate includes a first voltage having a first amplitude and a second voltage having a second amplitude.

An integrated circuit device under an embodiment wherein first write control signals include a signal applied to a gate and a signal applied to a drain region, wherein the signal applied to the gate includes a first voltage having a first amplitude and a second voltage having a second amplitude.

An integrated circuit device under an embodiment wherein first write control signals include a potential difference applied between a source region and a drain region of a number of the memory cells of a first row of memory cells.

An integrated circuit device under an embodiment wherein first write control signals include a signal applied to a gate, wherein the signal applied to the gate includes a first voltage having a first amplitude and a second voltage having a second amplitude.

An integrated circuit device under an embodiment wherein second write control signals can be applied to all of the memory cells of a first row of memory cells to write a second data state therein prior to applying the first write control signals.

An integrated circuit device under an embodiment wherein first write control signals can be at least substantially simultaneously applied to a portion of the memory cells of a first row of memory cells to write a first data state therein with second write control signals to the other portion of the memory cells of the first row of memory cells to write the second data state therein.

An integrated circuit device under an embodiment wherein first write control signals include a signal applied to a gate, a signal applied to a source region, and a signal applied to a drain region of a number of memory cells of a first row of memory cells to cause, provide, produce and/or induce a first source current, wherein the signal applied to the source region includes a first voltage having a first amplitude, the signal applied to the drain region includes a second voltage having a second amplitude, and the signal applied to the gate includes a third voltage having a third amplitude and a fourth voltage having a fourth amplitude.

An integrated circuit device under an embodiment wherein first write control signals include a first potential difference applied between a source region and a drain region and a signal applied to a gate of a number of memory cells of a first row of memory cells that includes a first voltage, wherein the first write control signals may cause, provide, produce and/or induce an accumulation of minority carriers at a surface region of a first portion of the body region.

An integrated circuit device under an embodiment wherein first write control signals cause, provide, produce and/or induce source current in a body region as a result of impact ionization induced by minority carriers.

An integrated circuit device under an embodiment wherein a signal applied to a gate temporally changes to a second voltage that causes, provides, produces and/or induces an accumulation of majority carriers in a body region, wherein the majority carriers result in a first data state.

An integrated circuit device under an embodiment wherein, in response to read control signals applied to memory cells, a transistor of each memory cell generates a second source current which is representative of a data state of a memory cell.

An integrated circuit device under an embodiment wherein read control signals include a signal applied to a gate, source region, and drain region to cause, force and/or induce a source current which is representative of a data state of a memory cell.

An integrated circuit device under an embodiment wherein read control signals include a first potential difference applied between a source region and drain region of a vertical transistor of a memory cell.

An integrated circuit device under an embodiment wherein a signal applied to a gate region includes a negative voltage pulse.

As mentioned above, each of the aspects of the present inventions, and/or embodiments thereof, may be employed alone or in combination with one or more of such aspects and/or embodiments. For the sake of brevity, those permutations and combinations will not be discussed separately herein. As such, the present inventions are neither limited to any single aspect (nor embodiment thereof), nor to any combinations and/or permutations of such aspects and/or embodiments.

Moreover, the above embodiments of the present inventions are merely example embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the example embodiments of the inventions has been presented for the purposes of illustration and description. Many modifications and variations are possible in light of the above teaching. It is intended that the scope of the inventions not be limited solely to the description above.

What is claimed is:

1. A semiconductor device comprising:
a body region configured to be electrically floating;
a gate disposed about a first boundary of the body region;
a drain region adjoining a second boundary of the body region, the second boundary adjacent the first boundary and separating the drain region from the first boundary; and
a source region separated from the drain region and adjoining a third boundary of the body region, the third boundary adjacent the first boundary and separating the source region from the first boundary;
wherein the body region comprises a vertical channel for a transistor.

2. The device of claim 1, comprising an insulating region adjoining the body region and isolating the body region from the gate.

3. The device of claim 2, wherein the insulating region comprises an oxide.

4. The device of claim 1, comprising an insulating region surrounding a portion of one of the drain region and source region.

5. The device of claim 4, comprising the gate surrounding a portion of the insulating region and a portion of one of the drain region and source region.

6. The device of claim 4, comprising the gate surrounding the insulating region and a portion of one of the body region, drain region, and source region.

7. The device of claim 4, comprising the gate surrounding the insulating region, the body region, and one of the drain region and source region.

8. The device of claim 1, wherein the source region is disposed below the third boundary of the body region.

9. The device of claim 8, wherein the source region is coupled to a source line.

10. The device of claim 1, wherein the source region is disposed above the second boundary of the body region.

11. The device of claim 10, wherein the source region is coupled to a source line.

12. The device of claim 1, wherein the drain region is disposed above the second boundary of the body region.

13. The device of claim 12, wherein the drain region is coupled to a bit line.

14. The device of claim 1, wherein the drain region is disposed below the third boundary of the body region.

15. The device of claim 14, wherein the drain region is coupled to a bit line.

16. The device of claim 1, wherein the drain region is disposed in a layer above and spaced apart from a source region layer.

17. The device of claim 1, wherein the drain region is disposed in a layer below and spaced apart from a source region layer.

18. The device of claim 1, the body region comprising a core region, the source and drain regions disposed above and below the core region, and an insulating layer encompassing a portion of one or more of the core region, the source region, and drain region.

19. The device of claim 1, the body region comprising a core region, the source and drain regions opposite one another and in separate planes about the core region, and an insulating layer surrounding portions of the core region, source region, and drain region.

20. The device of claim 1, comprising a substantially cylindrically configured transistor.

21. The device of claim 1, comprising a first voltage coupled to the gate, wherein the first voltage may cause minority carriers to accumulate in the body region.

22. The device of claim 21, wherein the minority carriers accumulate at a surface region of the body region adjacent to a gate dielectric which is disposed between the gate and the first boundary of the body region.

23. The device of claim 21, wherein a region that includes the minority carriers is disconnected from the source region by a portion of the third boundary of the body region.

24. The device of claim 21, wherein a region that includes the minority carriers is disconnected from the drain region by a portion the second boundary of the body region.

25. The device of claim 21, comprising a first potential difference coupled between the source and the drain, the first potential difference generating source current as a result of impact ionization of the minority carriers.

26. The device of claim 25, comprising a second voltage coupled to the gate after and instead of the first voltage, the second voltage causing an accumulation of majority carriers in the body region, wherein the majority carriers result in the first data state which is representative of a first charge in the body region.

27. The device of claim 21, comprising a second potential difference coupled between the source and the drain, the second potential difference resulting in a second data state which is representative of a second charge in the body region.

28. The device of claim 1, wherein the body region includes a first type of semiconductor material.

29. The device of claim 28, wherein the source region and drain region include a second type of semiconductor material.

30. The device of claim 28, wherein the source region includes a lightly doped region.

31. The device of claim 28, wherein the source region includes a highly doped region.

32. The device of claim 28, wherein the source region includes a lightly doped region and a highly doped region.

33. The device of claim 28, wherein the drain region includes a lightly doped region.

34. The device of claim 28, wherein the drain region includes a highly doped region.

35. The device of claim 28, wherein the drain region includes a lightly doped region and a highly doped region.

36. The device of claim 1, comprising a bit line coupled to the drain region.

37. The device of claim 36, comprising a source line coupled to the source region.

38. The device of claim 36, wherein the bit line can be coupled to adjacent drain regions such that hole diffusion between adjacent cells is reduced during a write operation.

39. The device of claim 1, wherein the gate comprises a write line associated with an adjacent gate.

40. A memory array including the device of claim 1.

41. A semiconductor device comprising:
  a gate;
  a body region configured as an electrically floating body, the body region configured so that material forming the body region extends beyond at least one vertical boundary of the gate; and
  a source region and a drain region adjacently disposed to the body region in opposing planes.

42. A transistor comprising:
  a source region disposed on an insulating substrate;
  a floating body region disposed over the source region;
  a drain region disposed over the floating body region and opposing the source region; and
  a gate encompassing the floating body region and a portion of one or more of the source region and drain region, wherein a doping profile of one or more of the source and the drain region is configured to prevent formation of a contiguous current channel extending between the source region and the drain region through the floating body region.

43. A method for forming a transistor, comprising:
  forming a source region by implanting an impurity into a first portion of a semiconductor;
  forming a floating body region over the source region, wherein the floating body includes a pillar structure and defines a vertical channel;
  forming an insulating layer and a gate to encompass the floating body region, wherein the insulating layer is disposed between the gate and the floating body region; and
  forming a drain region by implanting the impurity into a second portion of the semiconductor adjacent to the floating body region, wherein the drain region is formed to oppose the source region vertically.

44. The method of claim 43, comprising forming the floating body region using a first type of semiconductor material.

45. The method of claim 44, forming the source region and drain region using a second type of semiconductor material that is different from the first type.

46. The method of claim 43, wherein implanting the impurity into the first portion includes implanting to form a lightly doped source region.

47. The method of claim 43, wherein implanting the impurity into the first portion includes implanting to form a highly doped source region.

48. The method of claim 43, wherein implanting the impurity into the first portion includes implanting to form a source region that includes both a lightly doped source portion and a highly doped source portion.

49. The method of claim 43, wherein implanting the impurity into the second portion includes implanting to form a lightly doped drain region.

50. The method of claim 43, wherein implanting the impurity into the second portion includes implanting to form a highly doped drain region.

51. The method of claim 43, wherein implanting the impurity into the second portion includes implanting to form a drain region that includes both a lightly doped drain portion and a highly doped drain portion.

52. A semiconductor circuit device produced by the method of claim 43.

53. A semiconductor device produced by the method of claim 43, the semiconductor device comprising:
  a body region configured to be electrically floating, wherein the body region includes an outer surface, a lower surface, and an upper surface;
  a gate surrounding the outer surface of the body region;
  a source region adjoining the lower surface of the body region; and
  a drain region adjoining the upper surface of the body region.

54. An integrated circuit device comprising:
  a memory cell including a transistor, the transistor comprising:
    a body region configured to be electrically floating;
    a gate disposed about a first boundary of the body region;
    a drain region adjoining a second boundary of the body region, the second boundary adjacent the first boundary and separating the drain region from the first boundary; and a source region vertically separated from the drain region and adjoining a third boundary of the body region, the third boundary adjacent the first boundary and separating the source region from the first boundary;

wherein the memory cell includes a first data state representative of a first charge in the body region, wherein the memory cell includes a second data state representative of a second charge in the body region;

wherein first write control signals can be applied to the memory cell to write the first data state and second write control signals to the memory cell to write the second data state, wherein, in response to first write control signals, the electrically floating body transistor generates a first source current which substantially provides the first charge in the body region.

55. The integrated circuit device of claim 54, wherein the first write control signals cause, provide, produce and/or induce the first source current.

56. The integrated circuit device of claim 54, wherein the first write control signals include a signal applied to the gate and a signal applied to the source region, wherein the signal applied to the gate includes a first voltage having a first amplitude and a second voltage having a second amplitude.

57. The integrated circuit device of claim 54, wherein the first write control signals include a signal applied to the gate and a signal applied to the drain region, wherein the signal applied to the gate includes a first voltage having a first amplitude and a second voltage having a second amplitude.

58. The integrated circuit device of claim 54, wherein the first write control signals include a potential difference applied between the source region and the drain region.

59. The integrated circuit device of claim 58, wherein the first write control signals include a signal applied to the gate, wherein the signal applied to the gate includes a first voltage having a first amplitude and a second voltage having a second amplitude.

60. The integrated circuit device of claim 54, wherein the first write control signals include a signal applied to the gate, a signal applied to the source region, and a signal applied to the drain region to cause, provide, produce and/or induce the first source current, wherein:
 the signal applied to the source region includes a first voltage having a first amplitude;
 the signal applied to the drain region includes a second voltage having a second amplitude; and
 the signal applied to the gate includes a third voltage having a third amplitude and a fourth voltage having a fourth amplitude.

61. The integrated circuit device of claim 54, wherein the first write control signals include a first potential difference applied between the source region and the drain region and a signal applied to the gate that includes a first voltage, wherein the first write control signals may cause, provide, produce and/or induce an accumulation of minority carriers in the first portion of the body region.

62. The integrated circuit device of claim 61, wherein the minority carriers accumulate at a surface region of the body region that is juxtaposed or near a gate dielectric which is disposed between the gate and the body region.

63. The integrated circuit device of claim 61, wherein the first write control signals cause, provide, produce and/or induce current in the body region as a result of impact ionization induced by the minority carriers.

64. The integrated circuit device of claim 61, wherein the signal applied to the gate temporally changes to a second voltage that causes, provides, produces and/or induces an accumulation of majority carriers in the first portion of the body region, wherein the majority carriers result in the first data state.

65. The integrated circuit device of claim 61, wherein the second write control signals include a second potential difference applied between the source region and the drain region and a signal applied to the gate that includes the first voltage, wherein the second write control signals prevent the first data state from being written into the body transistor.

66. The integrated circuit device of claim 65, wherein the second potential difference is relatively less than the first potential difference.

67. The integrated circuit device of claim 54, wherein, in response to read control signals applied to the memory cell, the transistor generates a second source current which is representative of the data state of the memory cell.

68. The integrated circuit device of claim 67, wherein the read control signals include a signal applied to the gate, source region, and drain region to cause, force and/or induce the source current which is representative of the data state of the memory cell.

69. The integrated circuit device of claim 67, wherein the read control signals include a first potential difference applied between the source region and the drain region.

70. The integrated circuit device of claim 54, comprising a bit line coupled to the drain region.

71. The integrated circuit device of claim 70, comprising a source line coupled to the source region.

72. The integrated circuit device of claim 70, wherein the bit line can be coupled to adjacent drain regions such that hole diffusion between adjacent cells is reduced during a write operation.

73. An integrated circuit device comprising:
 a memory cell array including:
  a plurality of word lines;
  a plurality of source lines;
  a plurality of bit lines; and
  a plurality of memory cells arranged in a matrix of rows and columns, wherein each memory cell includes a transistor comprising:
   a body region configured to be electrically floating;
   a gate disposed about a first boundary of the body region, the gate coupled to an associated word line;
   a drain region adjoining a second boundary of the body region, the second boundary adjacent the first boundary and separating the drain region from the first boundary, the drain region coupled to an associated bit line; and
   a source region vertically separated from the drain region and adjoining a third boundary of the body region, the third boundary adjacent the first boundary and separating the source region from the first boundary, the source region coupled to an associated source line;
  wherein each memory cell includes a first data state representative of a first charge in the body region, wherein each memory cell includes a second data state representative of a second charge in the body region;
  wherein the drain region of each memory cell of a first column of memory cells is connected to a first bit line;
  wherein the source region of each memory cell of a first row of memory cells is connected to a first source line;
  wherein, in response to first write control signals applied to at least a portion of the memory cells of the first row of memory cells, the electrically floating body transistor of each memory cell of the portion of the memory cells of the first row of memory cells generates a first source current which at least substantially provides the first charge in the body region of the electrically floating body transistor of the portion of the memory cells of the first row of memory cells.

74. The integrated circuit device of claim 73, wherein the first bit line comprises a metal and the coupled drain regions of each memory cell reduces hole disturb to an adjacent memory cell during a write operation.

75. The integrated circuit device of claim 73, wherein the source region of each memory cell of a second row of memory cells is connected to a second source line.

76. The integrated circuit device of claim 75, wherein the drain region of each memory cell of a second column of memory cells is connected to a second bit line.

77. The integrated circuit device of claim 73, comprising:
the source region of each memory cell of a second row of memory cells connected to a second source line;
the drain region of each memory cell of a second column of memory cells connected to a second bit line;
the source region of each memory cell of a third row of memory cells connected to a third source line, wherein the second and third rows of memory cells are adjacent to the first row of memory cells; and
the drain region of each memory cell of a third column of memory cells connected to a third bit line, wherein the second and third columns of memory cells are adjacent to the first column of memory cells.

78. The integrated circuit device of claim 73, wherein the first write control signals cause, provide, produce and/or induce the first source current.

79. The integrated circuit device of claim 73, wherein the first write control signals include a signal applied to the gate and a signal applied to the source region, wherein the signal applied to the gate includes a first voltage having a first amplitude and a second voltage having a second amplitude.

80. The integrated circuit device of claim 73, wherein the first write control signals include a signal applied to the gate and a signal applied to the drain region, wherein the signal applied to the gate includes a first voltage having a first amplitude and a second voltage having a second amplitude.

81. The integrated circuit device of claim 73, wherein the first write control signals include a potential difference applied between the source region and the drain region of a number of the memory cells of the first row of memory cells.

82. The integrated circuit device of claim 81, wherein the first write control signals include a signal applied to the gate, wherein the signal applied to the gate includes a first voltage having a first amplitude and a second voltage having a second amplitude.

83. The integrated circuit device of claim 73, wherein second write control signals can be applied to all of the memory cells of the first row of memory cells to write the second data state therein prior to applying the first write control signals.

84. The integrated circuit device of claim 73, wherein the first write control signals can be at least substantially simultaneously applied to the portion of the memory cells of the first row of memory cells to write the first data state therein with the second write control signals to the other portion of the memory cells of the first row of memory cells to write the second data state therein.

85. The integrated circuit device of claim 73, wherein the first write control signals include a signal applied to the gate, a signal applied to the source region, and a signal applied to the drain region of a number of memory cells of the first row of memory cells to cause, provide, produce and/or induce the first source current, wherein:
the signal applied to the source region includes a first voltage having a first amplitude;
the signal applied to the drain region includes a second voltage having a second amplitude; and
the signal applied to the gate includes a third voltage having a third amplitude and a fourth voltage having a fourth amplitude.

86. The integrated circuit device of claim 73, wherein the first write control signals include a first potential difference applied between the source region and the drain region and a signal applied to the gate of a number of memory cells of the first row of memory cells that includes a first voltage, wherein the first write control signals may cause, provide, produce and/or induce an accumulation of minority carriers at a surface region of the first portion of the body region.

87. The integrated circuit device of claim 86, wherein the first write control signals cause, provide, produce and/or induce source current in the body region as a result of impact ionization induced by the minority carriers.

88. The integrated circuit device of claim 86, wherein the signal applied to the gate temporally changes to a second voltage that causes, provides, produces and/or induces an accumulation of majority carriers in the body region, wherein the majority carriers result in the first data state.

89. The integrated circuit device of claim 73, wherein, in response to read control signals applied to the memory cells, the transistor of each memory cell generates a second source current which is representative of the data state of the memory cell.

90. The integrated circuit device of claim 89, wherein the read control signals include a signal applied to the gate, source region, and drain region to cause, force and/or induce the source current which is representative of the data state of the memory cell.

91. The integrated circuit device of claim 89, wherein the read control signals include a first potential difference applied between the source region and the drain region.

92. The integrated circuit device of claim 91, wherein the signal applied to the gate region includes a negative voltage pulse.

* * * * *

UNITED STATES PATENT AND TRADEMARK OFFICE
CERTIFICATE OF CORRECTION

PATENT NO.         : 8,213,226 B2                                          Page 1 of 1
APPLICATION NO.    : 12/632394
DATED              : July 3, 2012
INVENTOR(S)        : Eric Carman It is certified that error appears in the above-identified patent and that said Letters Patent is hereby corrected as shown below:

In column 25, line 14, in Claim 24, delete "a portion the" and insert -- a portion of the --, therefor.

Signed and Sealed this
Twenty-eighth Day of August, 2012

David J. Kappos
*Director of the United States Patent and Trademark Office*